US009910081B2

(12) United States Patent
Biswas et al.

(10) Patent No.: US 9,910,081 B2
(45) Date of Patent: Mar. 6, 2018

(54) PERFORMANCE ANALYSIS OF POWER GRID MONITORS

(71) Applicant: WASHINGTON STATE UNIVERSITY, Pullman, WA (US)

(72) Inventors: Saugata Swapan Biswas, Kirkland, WA (US); Anurag Srivastava, Pullman, WA (US)

(73) Assignee: Washington State University, Pullman, WA (US)

(*) Notice: Subject to any disclaimer, the term of this patent is extended or adjusted under 35 U.S.C. 154(b) by 0 days.

(21) Appl. No.: 15/030,573

(22) PCT Filed: Oct. 20, 2014

(86) PCT No.: PCT/US2014/061412
§ 371 (c)(1),
(2) Date: Apr. 19, 2016

(87) PCT Pub. No.: WO2015/061227
PCT Pub. Date: Apr. 30, 2015

(65) Prior Publication Data
US 2016/0252562 A1 Sep. 1, 2016

Related U.S. Application Data

(60) Provisional application No. 61/893,362, filed on Oct. 21, 2013.

(51) Int. Cl.
G01R 31/08 (2006.01)
G01R 19/25 (2006.01)
G01R 33/00 (2006.01)

(52) U.S. Cl.
CPC ....... *G01R 31/088* (2013.01); *G01R 19/2513* (2013.01); *G01R 31/086* (2013.01);
(Continued)

(58) Field of Classification Search
None
See application file for complete search history.

(56) References Cited

U.S. PATENT DOCUMENTS 6,662,124 B2 * 12/2003 Schweitzer, III .... H02H 1/0007
324/76.15
8,457,912 B1 * 6/2013 Wells ...................... H02J 3/24
702/60

(Continued)

OTHER PUBLICATIONS

International Search Report and Written Opinion dated Jan. 21, 2015, in International Application No. PCT/US14/061412, 9 pages.

*Primary Examiner* — Jermele M Hollington
*Assistant Examiner* — Suresh K Rajaputra
(74) *Attorney, Agent, or Firm* — Liang IP, PLLC

(57) ABSTRACT

Systems and methods for analyzing performance of a power grid monitor are disclosed herein. In one embodiment, a method includes receiving test data from a test power grid monitor coupled to a power grid signal source and receiving reference data from a reference power grid monitor coupled to the same power grid signal source. The method also includes identifying a power grid condition based on the received test data and/or reference data, extracting a subset of the test data and a subset of the reference data corresponding to the identified power grid condition, and comparing the subset of the test data to the subset of the reference data to determine a measurement accuracy of the test power grid monitor.

20 Claims, 34 Drawing Sheets

(52) U.S. Cl.
CPC ............ *G01R 33/00* (2013.01); *Y02E 60/728* (2013.01); *Y04S 10/265* (2013.01); *Y04S 10/522* (2013.01)

(56) References Cited

U.S. PATENT DOCUMENTS

| | | | | |
|---|---|---|---|---|
| 2006/0224336 | A1* | 10/2006 | Petras | H04L 12/66 |
| | | | | 702/62 |
| 2006/0259255 | A1* | 11/2006 | Anderson | G06F 19/00 |
| | | | | 702/64 |
| 2009/0123340 | A1 | 5/2009 | Knudsen et al. | |
| 2010/0185336 | A1* | 7/2010 | Rovnyak | H02J 3/38 |
| | | | | 700/287 |
| 2010/0213925 | A1* | 8/2010 | Teodorescu | G01R 19/2513 |
| | | | | 324/76.78 |
| 2011/0106321 | A1* | 5/2011 | Cherian | H02J 3/00 |
| | | | | 700/286 |
| 2012/0179301 | A1* | 7/2012 | Aivaliotis | H02J 3/00 |
| | | | | 700/286 |
| 2013/0345999 | A1* | 12/2013 | Hafen | G01R 21/133 |
| | | | | 702/60 |
| 2014/0070617 | A1* | 3/2014 | Detmers | H02J 7/041 |
| | | | | 307/64 |
| 2014/0300210 | A1* | 10/2014 | Abi-Ackel | H04Q 9/00 |
| | | | | 307/130 |
| 2016/0091537 | A1* | 3/2016 | Gaarder | G06Q 10/00 |
| | | | | 324/764.01 |

\* cited by examiner

PERFORMANCE ANALYSIS OF POWER GRID MONITORS

CROSS-REFERENCE TO RELATED APPLICATION(S)

This application claims priority to U.S. Provisional Application No. 61/893,362, entitled "A NOVEL METHODOLOGY FOR TESTING PHASOR MEASUREMENT UNITS (PMUS) USING A PMU PERFORMANCE ANALYZER" filed Oct. 21, 2013.

BACKGROUND

Electrical grids or power grids are interconnected networks of electrical power producers, transmission lines, and local distribution systems. For example, a power grid can include power plants that produce electricity, transmission lines that carry the produced electricity to local substations, and distribution lines that deliver the electricity to customers from the local substations. In general, a power grid is stable when an amount of electricity produced approximately matches that of consumed. A large imbalance between power production and consumption may trigger a shutdown of the entire power grid, and causing what commonly referred to as a "blackout."

DETAILED DESCRIPTION

Specific details of several embodiments of the technology are described below with reference to systems and methods for analyzing performance of power grid monitoring devices. Several embodiments can have configurations, components, or procedures different than those described in this section, and other embodiments may eliminate particular components or procedures. A person of ordinary skill in the relevant art, therefore, would understand that the technology may have other embodiments with additional elements, and/or may have other embodiments without several of the features shown and described below with reference to FIGS. 1-22.

As used herein, the term "power grid monitor" or "monitor" generally refers to an apparatus that can measure one or more of an electrical voltage, current, phase angle, frequency, a rate of change of frequency, and/or other suitable operating parameters of a power grid. One example power grid monitor is a phasor measurement unit ("PMU") that can be configured to measure voltage and/or current phasors of a power grid and generate phasor measurement records that are time-stamped based on a common time reference provided by, for instance, a global positioning satellite ("GPS"). In certain embodiments, a power grid monitor can be a standalone device with suitable hardware and/or software. In other embodiments, a power grid monitor may be "virtual" and include software modules that are incorporated into protective relays and/or other suitable components of a power grid. In further embodiments, a power grid monitor may include a combination of standalone devices and virtual software modules.

Deploying power grid monitors in various locations of a power grid can provide a wide area visualization of operations in the power grid. For example, phasor measurement records may be synchronized to provide a comprehensive view of the status or conditions of the power grid. The power grid monitors may require testing and/or validation of capabilities and/or accuracy before deployment. However, conventional techniques for testing power grid monitors generally involve manual efforts and thus are laborious and costly. For instance, manually testing a PMU according to the IEEE Standard for Synchrophasor Measurements C37.118.1 can take up to six months and cost more than twenty thousand dollars. Several embodiments of the present technology are directed to techniques to analyze performance of power grid monitors with reduced time and costs when compared to conventional techniques.

Figure 1:
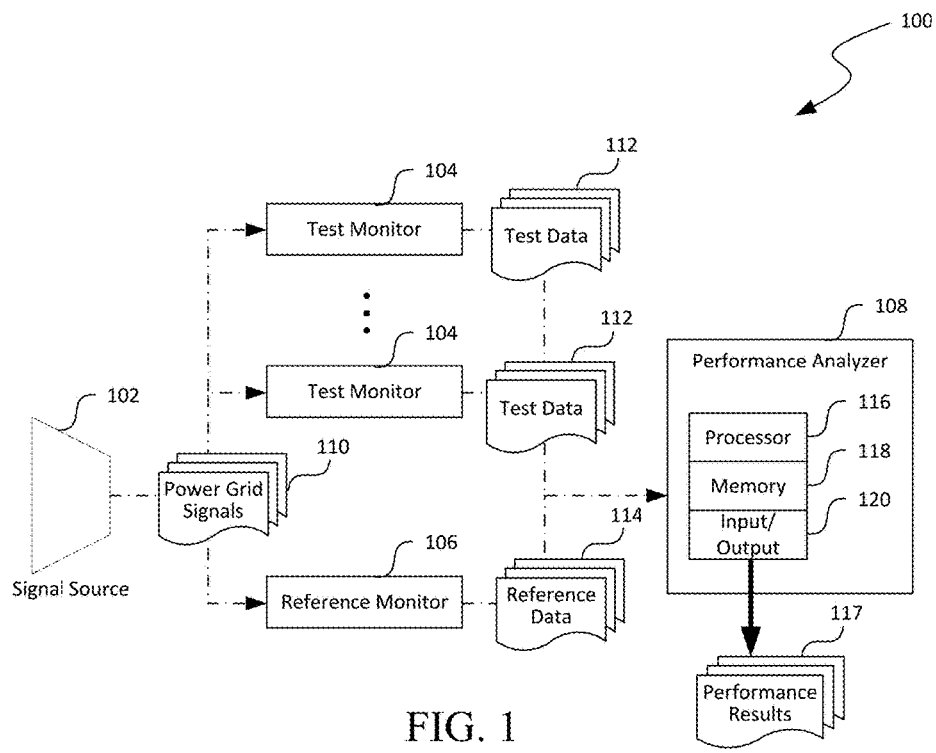
FIG. 1 is a schematic diagram of a computing framework for analyzing power grid monitors in accordance with embodiments of the present technology.

FIG. 1 is a schematic diagram of a computing framework 100 for analyzing power grid monitors in accordance with embodiments of the present technology. As shown in FIG. 1, the computing framework 100 can include a signal source 102, one or more test monitors 104, a reference monitor 106 and a performance analyzer 108 operatively coupled to one another. Even though only the foregoing components of the computing framework 100 are shown in FIG. 1, in other embodiments, the computing framework 100 can also include signal processing, communications, and/or other suitable types of components in addition to or in lieu of the components shown in FIG. 1.

As shown in FIG. 1, the one or more test monitors 104 and the reference monitor 106 are coupled to the signal source 102 to receive the same power grid signals 110. The signal source 102 can be configured to concurrently provide power grid signals 110 to the test monitors 104 and the reference monitor 106. In one embodiment, the signal source 102 may be obtained from a power plant, a substation, a transmission line, or other suitable locations in a utility power grid, via suitable sensing, transmitting, conditioning, and/or storing infrastructures. In other embodiments, the signal source 102 can include a power grid simulator configured to output simulated power grid signals 110. One example power grid simulator is the RTDS® Simulator provided by RTDS® Technologies, Inc. of Winnipeg, Canada. In further embodiments, the signal source 102 may also include historical and/or other suitable types of data related to the power grid signals 110.

The test and reference monitors 104 and 106 can be individually configured to generate power grid data (shown as test data 112 and reference data 114) based on the same power grid signals 110 from the signal source 102. The test data 112 and/or the reference data 114 can include one or more of the following:

Time Stamp
Voltage Magnitude of Phase A, B, or C
Voltage Angle of Phase A
Current Magnitude of Phase A, B, or C
Frequency
Rate of change of frequency The reference monitor 104 can be a monitor that is believed to provide sufficiently accurate power grid parameters based on input power grid signals 110. For instance, the reference monitor 104 may be a monitor certified by a government entity as being accurate. In other instances, the reference monitor 104 may be a monitor that has industrial acceptance as being sufficiently accurate. For example, in one embodiment, a suitable reference monitor 104 may include a GTNET® PMU provided by RTDS® Technologies, Inc. of Winnipeg, Canada. In other embodiments, the reference monitor 104 can include other suitable tested, calibrated, licensed, and/or other monitors deemed as sufficiently accurate. The test and reference monitors 104 and 106 can individually include a PMU or other suitable types of monitoring device. One example monitor suitable for the test or reference monitor 104 or 106 are described in more detail below with reference to FIG. 2.

The performance analyzer 108 is configured to (1) receive and store the test data 112 and the reference data 114; and (2) analyze the received test data 112 and the reference data 114 to generate performance results 117 for the individual test monitors 104. As shown in FIG. 1, the performance analyzer 108 can include a processor 116 coupled to a memory 118 and an input/output component 120. The processor 116 can include a microprocessor, a field-programmable gate array, and/or other suitable logic devices. The memory 118 can include non-transitory volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 116 (e.g., instructions for performing the methods discussed below with reference to FIGS. 4-6). The input/output component 120 can include a display, a touch screen, a keyboard, a mouse, a printer, and/or other suitable types of input/output devices configured to accept input from and provide output to an operator.

In certain embodiments, the performance analyzer 108 can include a personal computer operatively coupled to the other components of the computing framework 100 via a communication link (e.g., a USB link, an Ethernet link, a Bluetooth link, etc.) In other embodiments, the performance analyzer 108 can include a network server operatively coupled to the other components of the computing framework 100 via a network connection (e.g., an internet connection, an intranet connection, etc.). In further embodiments, the performance analyzer 108 can include a process logic controller, a distributed control system, and/or other suitable computing devices.

In operation, the signal source 102 provides the power grid signals 110 to the test monitors 104 and the reference monitor 106 at the same time. The test monitors 104 and the reference monitor 106 individually generate test data 112 and reference data 114, respectively, and transmit the generated test and reference data 112 and 114 to the performance analyzer 108. The performance analyzer 108 can then perform at least one of (1) receiving and storing the received test and reference data 112 and 114; and (2) analyzing the received test and reference data 112 and 114 to generate performance results 117 for the individual test monitors 104.

In certain embodiments, analyzing the received test and reference data 112 and 114 can initially include "aligning" the test and reference data 112 and 114 based on, for example, a time stamp associated with the test and reference data 112 and 114. For example, in one embodiment, the time stamp of individual test and reference data 112 and 114 may be converted, for instance, using an Epoch converter, to a numerical value. The individual data points in the test and reference data 112 and 116 may then be grouped or "aligned" based on the generated numerical values. In other embodiments, the test and reference data 112 and 114 may be aligned in other suitable manners.

After aligning the test and reference data 112 and 114, the performance analyzer 108 can analyze the aligned test and reference data 112 and 114 to identify subsets of the test and reference data 112 and 114 that correspond to a steady state and/or dynamic conditions in a power grid. Examples of such conditions are listed in the Table 1 below:

| Category | Parameters Changed | System Condition | Performance Parameters |
|---|---|---|---|
| Steady State | Voltage & Current Magnitude | System is balanced | Total Vector Error (TVE), Frequency Error (FE), Rate of Change Error (RFE) |
| | | System is at off-nominal frequency | TVE, FE, RFE |
| | | System has harmonics | TVE, FE, RFE |
| | | System is at off-nominal frequency and has harmonics | TVE, FE, RFE |
| | Voltage & Current Angle | System is balanced | TVE, FE, RFE |
| | | System has harmonics | TVE, FE, RFE |
| | Frequency | System is balanced | TVE, FE, RFE |
| | | System has harmonics | TVE, FE, RFE |
| Dynamic | Voltage Magnitude Step | System is balanced, at nominal frequency, without harmonics | Response Time, Delay Time, % Peak Overshoot |
| | Voltage Angle Step | System is balanced, at nominal frequency, without harmonics | Response Time, Delay Time, % Peak Overshoot |
| | Frequency Step | System is balanced, at nominal frequency, without harmonics | Frequency Response Time, Rate Of Change Of Frequency (ROCOF) Response Time, Delay Time, % Peak Overshoot |
| | Frequency Ramp | System is balanced, at nominal frequency, without harmonics | FE, RFE |
| | Amplitude, Phase & Frequency Modulation | System is balanced, at nominal frequency, without harmonics | TVE, FE, RFE |

In other embodiments, additional and/or different conditions may also be monitored and/or utilized to characterize performance of the test monitors 104. Additional examples of the test conditions and/or parameters are listed in Appendix A, which forms an integral part of this application.

Based on the identified subsets of the test and reference data 112 and 114, the performance analyzer 108 can then compare at least a portion of the test and reference data 112 and 114 to find conformance of the test data 112 with the reference data 114. The performance evaluation parameters for each test, for example, in Table 1 above can be computed. The following is a brief description of certain example performance evaluation parameters:

(a) Total Vector Error (TVE)—

$$TVE(n) = \sqrt{\frac{(\hat{X}_r(n) - X_r(n))^2 + (\hat{X}_i(n) - X_i(n))^2}{(X_r(n))^2 + (X_i(n))^2}}$$

Where, $\hat{X}_r(n)$ and $\hat{X}_i(n)$ are sequences of estimates given by a test monitor 104, and $X_r(n)$ and $X_i(n)$ are sequences of values of the measurements at the instants of time (n) read by the reference monitor 106.

(b) Frequency Error (FE)—

$$FE = |f_{true} - f_{measured}|$$

Where, $f_{true}$ is the frequency measured by the reference monitor 106, and $f_{measured}$ is the frequency measured by the test monitor 104.

(c) Rate of Change of Frequency or ROCOF Error (RFE)—

$$RFE = |(df/dt)_{true} - (df/dt)_{measured}|$$

Where, $$\left(\frac{df}{dt}\right)\text{true}$$

is the ROCOF measured by the reference monitor 106, and $$\left(\frac{df}{dt}\right)\text{true}$$

is the ROCOF measured by the test PMU.

(d) Measurement Response Time

Measurement response time is the time to transition between two steady-state measurements before and after a step change is applied to the input (e.g., the power grid signals 110). Measurement response time is determined as the difference between the time that the measurement leaves a specified accuracy limit and the time it reenters and stays within that limit when a step change is applied to the input. This can be measured by applying a positive or negative step change in phase or magnitude or frequency to the input. The input can be held at a steady-state condition before and after the step change.

(e) Measurement Delay Time

Measurement delay time is defined as a time interval between an instant that a step change is applied to the input and a measurement time that the stepped parameter achieves a value that is halfway between the initial and final steady-state values. Both the step time and measurement time may be measured on the UTC time scale. This measurement may be determined by applying a positive or negative step change in phase or magnitude or frequency to the input. The input can be held at a steady-state condition before and after the step change.

(f) Peak Overshoot

This is the maximum value by which the measured value exceeds the final steady state value when a positive step change is applied in phase or magnitude or frequency to the input. The input may be held at a steady-state condition before and after the step change. The only input signal change during this test may be the parameter(s) that have been stepped.

In certain embodiments, the performance analyzer 108 can optionally generate a report of the performance results 117 for the individual test monitors 104. In other embodiments, the performance analyzer 108 may transmit, store, print, and/or otherwise process the performance results 117 without generating the report.

Several embodiments of the computing framework 100 can be much more efficient in performance analysis of test monitors 104 than conventional techniques. As discussed above, manually testing a PMU according to the IEEE Standard for Synchrophasor Measurements C37.118.1 can take up to six months and cost more than twenty thousand dollars. In several experiments conducted utilizing embodiments of the computing framework 100, performance analysis of a test monitor 104 took about 70 minutes. Thus, several embodiments of the computing framework 100 can significantly reduce the amount of time and costs involved in testing power grid monitors.

Figure 2:
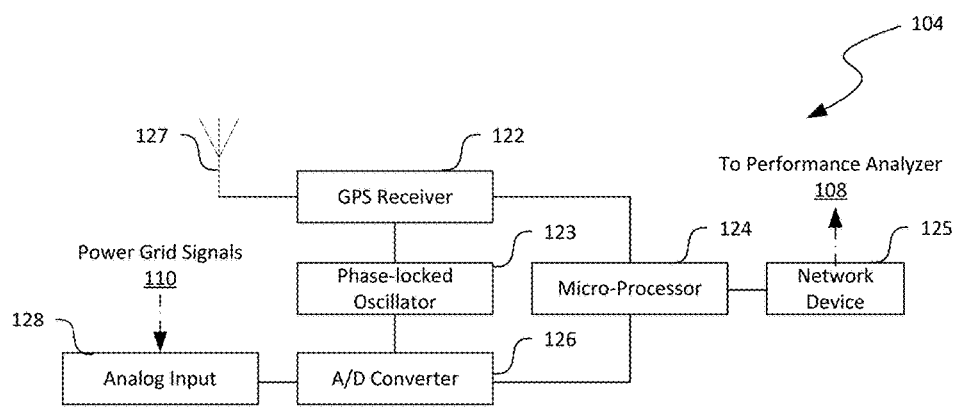
FIG. 2 is a block diagram showing example components of a power grid monitor in FIG. 1 in accordance with embodiments of the present technology.

FIG. 2 is a block diagram showing example components of a power grid monitor 104 in FIG. 1 in accordance with embodiments of the present technology. As shown in FIG. 2, the power grid monitor 104 can include an antenna 127 coupled to a GPS receiver 122, a phase-locked oscillator 123, an A/D converter 126, a micro-processor 124, and an analog input 128 operatively coupled to one another. Even though FIG. 2 only shows the foregoing components, in other embodiments, the power grid monitor 104 can also include a power supply, a temperature sensor, and/or other suitable components.

The analog input 128 can include suitable hardware and/or firmware to receive the power grid signals 110 as, for example, 4-20 mA or 0-5 volt signals. The A/D converter 126 can then digitize the analog signal from the analog input 128. The micro-processor 124 can be configured to cause the phase-locked oscillator 123 to generate a time stamp for the digitized signal from the A/D converter 126 based on a GPS signal from the GPS receiver 122. The power grid monitor 104 can further include a network device 125 (e.g., a network interface card, a wireless modem, etc.) that is configured to transmit the digitized signal with the time stamp to the performance analyzer 108 and/or other suitable destinations.

Figure 3:
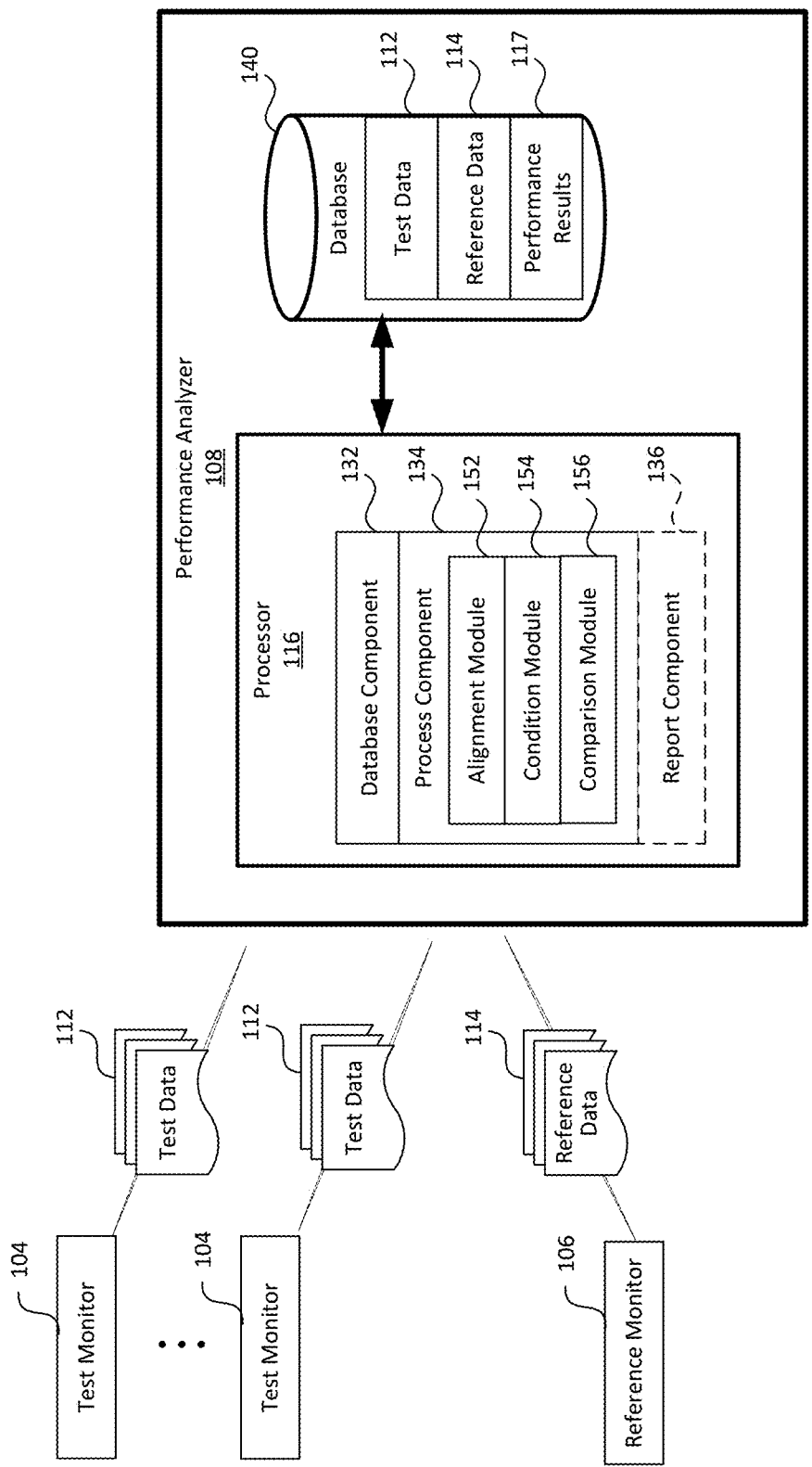
FIG. 3 is a block diagram showing example components of a performance analyzer for characterizing performance of the power grid monitor in FIG. 1 in accordance with embodiments of the present technology.

FIG. 3 is a block diagram showing software modules of the performance analyzer 108 of FIG. 1 in accordance with embodiments of the present technology. In FIG. 3 and in other Figures herein, individual software modules, components, and routines may be a computer program, procedure, or process written as source code in C, C#, C++, Java, MATLAB, and/or other suitable programming languages. The computer programs, procedures, or processes may be compiled into intermediate, object or machine code and presented for execution by a processor of a personal computer, a network server, a laptop computer, a smart phone, a tablet, and/or other suitable computing devices. Various implementations of the source, intermediate, and/or object code and associated data may be stored in one or more computer readable storage media that include read-only memory, random-access memory, magnetic disk storage media, optical storage media, flash memory devices, and/or other suitable media. As used herein, the term "computer readable storage medium" excludes propagated signals, per se.

As shown in FIG. 3, the processor 116 of the performance analyzer 108 can include a database component 132, a process component 134, and an optional report component 136 operatively coupled to one another. The database module 132 organizes records, including the test data 112 and the reference data 114, and facilitates storing and retrieving of these records to and from the database 140 which may be maintained in the memory 118 (FIG. 1) of the performance analyzer 108 and/or other suitable data storage locations. Any type of database organization may be utilized, including a flat file system, hierarchical database, relational database, or distributed database, such as provided by a database vendor such as the Oracle Corporation, Redwood Shores, Calif.

The process component 134 can include an alignment module 152, a condition module 154, and a comparison module 156 operatively coupled to one another. The alignment module 152 can be configured to align the test data 112 and the reference data 114 as discussed above with reference to FIG. 1. The condition module 154 can be configured to recognize one or more of the power grid conditions shown in Table 1 or other suitable conditions. For example, in one embodiment, the condition module 154 may monitor a magnitude of voltage over a period of time and determine if a step change has occurred based on a current value of the voltage in comparison to a historical average of the voltage. The comparison module 156 can be configured to compare a portion of the test data 112 to a portion of the reference data 114 for one or more of the identified conditions in the power grid; and determine performance results 117 indicating a conformance between the test data 112 and the reference data 114. The conformance may be represented one or more of TVE, FE, RFE, Response Time, Delay Time, % Peak Overshoot, Frequency Response Time, Rate Of Change Of Frequency (ROCOF) Response Time, and/or other suitable parameters. The performance results 117 may be stored in the database 140 facilitated by the database component 132. The processor 116 can also include an optional report component 136 configured to generate a report for the individual test monitors 104.

Figure 4:
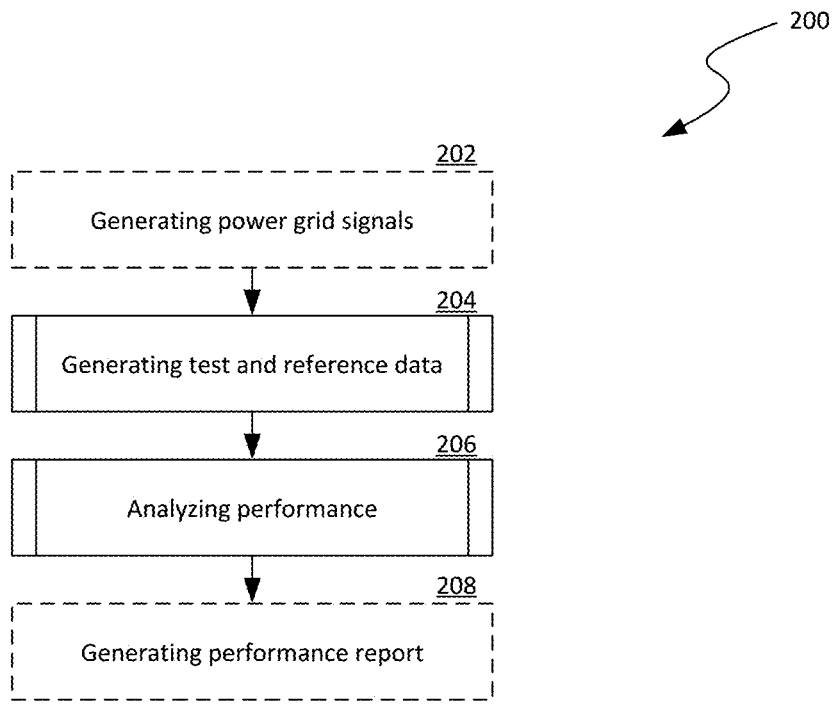
FIG. 4 is a flowchart illustrating a method of characterizing performance of power grid monitors in accordance with embodiments of the technology.

FIG. 4 is a flowchart illustrating a method 200 of characterizing performance of power grid monitors in accordance with embodiments of the technology. Even though operations of the method 200 are described below with reference to the computing framework 100 of FIG. 1, in other embodiments, the method 200 may also be implemented in other systems and/or devices.

As shown in FIG. 4, the method 200 can include an optional stage 202 at which power grid signals 110 (FIG. 1) are generated. In one embodiment, the power grid signals can be generated using a power grid simulator such as the RTDS® Simulator. In other embodiments, the power grid signals 110 may be generated by retrieving historical power grid signals, recording current power grid signals, and/or in other suitable manners. In further embodiments, the stage 202 of generating power grid signals 202 may be omitted, and the power grid signals may be obtained from a utility power grid (not shown).

The method 200 can include generating test and reference data 112 and 114 (FIG. 1) based on the same power grid signals 110 at stage 204. In certain embodiments, the test data 112 is generated by a test monitor 104 (FIG. 1) under test, and the reference data is generated by a reference monitor 106 (FIG. 1) believed to be sufficiently accurate. In other embodiments, the test data 112 can be generated by a plurality of test monitors 104 under test concurrently based on the same power grid signals 110. In further embodiments, the test data and/or reference data may be generated in other suitable manners. Example operations of generating the test and reference data 112 and 114 are described in more detail below with reference to FIG. 5.

The method 200 can also include analyzing performance of the test monitors 104 based on the test and reference data 112 and 114 at stage 206. In certain embodiments, the test and reference data 112 and 114 are initially aligned based on, for example, a time stamp associated with each data point. The test and reference data 112 and 114 can also be analyzed to identify one or more power grid conditions such as those shown in Table 1 above. Based on the identified conditions, subsets of the test and reference data 112 and 114 can be extracted and compared to generate performance results 117 (FIG. 1) that may show a conformance of the test data 112 to the reference data 114. Example operations of analyzing the test and reference data 112 and 114 are described in more detail below with reference to FIG. 5.

The method 200 can optionally include generating a performance report based on the performance results at stage 208. In one embodiment, the performance report includes one or more of power grid conditions and corresponding conformance (or error) between the test data 112 and the reference data 114. In another embodiment, the performance report may simply show a pass or fail for the performance of the test monitor 104. In further embodiments, the performance report may show a combination of the foregoing information and/or other suitable information.

Figure 5:
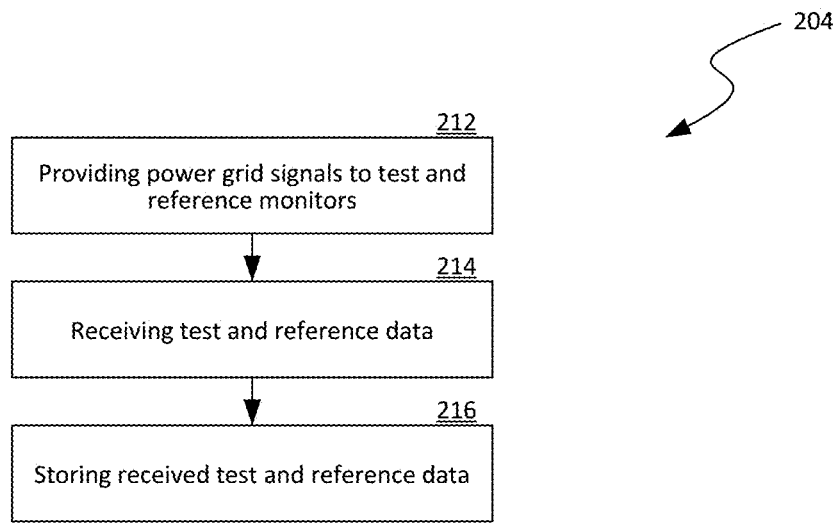
FIG. 5 is a flowchart illustrating a method of generating test and reference data for characterizing performance of power grid monitors in accordance with embodiments of the technology.

FIG. 5 is a flowchart illustrating a method 204 of generating test and reference data 112 and 114 (FIG. 1) for characterizing performance of power grid monitors in accordance with embodiments of the technology. As shown in FIG. 5, the method 204 can include providing the same power grid signals 110 (FIG. 1) to test and reference monitors 104 and 106 (FIG. 1) at stage 212. The method 204 can then include receiving test and reference data 112 and 114 generated by the test and reference monitors, respectively, at stage 214. The method 204 can then include storing the received test and reference data 112 and 114 in, for example, the database 140 (FIG. 3) of the performance analyzer 108 (FIG. 1), or other suitable data storage locations. In certain embodiments, operations of the method 204 may be performed by a power data concentrator (not shown) that may be a part of the performance analyzer 108 or a standalone module, component, or device.

Figure 6:
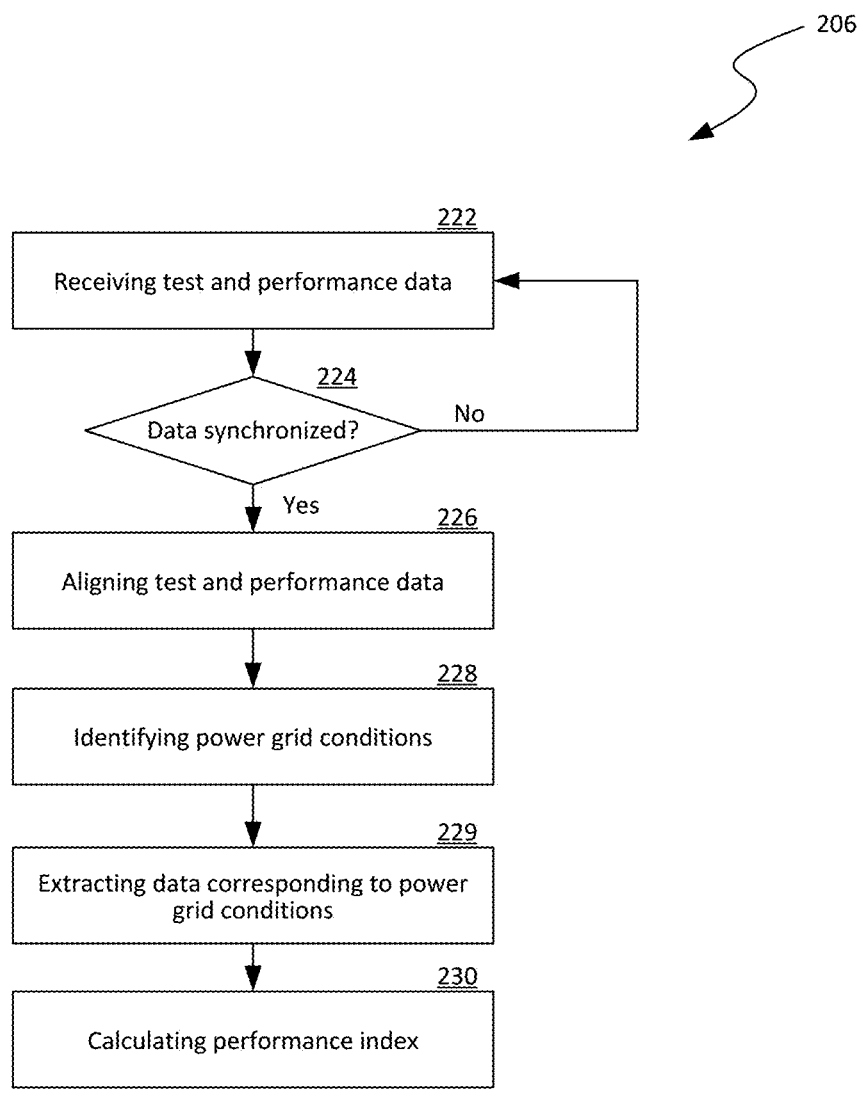
FIG. 6 is a flowchart illustrating a method of analyzing performance of power grid monitors in accordance with embodiments of the technology.

FIG. 6 is a flowchart illustrating a method 206 of analyzing performance of power grid monitors in accordance with embodiments of the technology. As shown in FIG. 6, the method 206 can include receiving test and performance data 112 and 114 (FIG. 1) at stage 222. The method 206 can then include a decision stage 224 to determine if the test and/or reference data 112 and 114 are synchronized. In one embodiment, the test and/or reference data 112 and 114 are synchronized if the test and/or reference data 112 and 114 include data points with at least generally similar time stamps. In other embodiments, the test and/or reference data 112 and 114 may be deemed synchronized based on other suitable criteria.

If the data is not synchronized, the method 206 reverts to receiving additional test and performance data 112 and 114 at stage 222. If the data is synchronized, the process proceeds to aligning the received test and performance data, for example, based on corresponding time stamps, at stage 226. The method 206 can also include identifying power grid conditions based on the received test and reference data 112 and 114 at stage 228, and extracting subsets of data corresponding to the identified power grid conditions from the test and reference data 112 and 114. The method then includes calculating one or more performance indices based on the extracted subsets of data for the corresponding power grid conditions at stage 230. Examples of performance indices include one or more of TVE, FE, RFE, Response Time, Delay Time, % Peak Overshoot, Frequency Response Time, Rate Of Change Of Frequency (ROCOF) Response Time, and/or other suitable parameters.

Experiments

Experiments have been conducted to test effectiveness of embodiments of the computing framework 100 for analyzing performance of power grid monitors. In the experiments, PMUs were used as sample power grid monitors though implementations of the computing framework 100 may also be used for other suitable types of power grid monitors. An RTDS® Simulator and a GTNET PMU were used as the signal source 102 and the reference monitor 106, respectively. FIGS. 7A-21C illustrate example power grid conditions and corresponding performance results, as discussed in more detail below.

Discussion on Steady State Tests

Figure 7A:
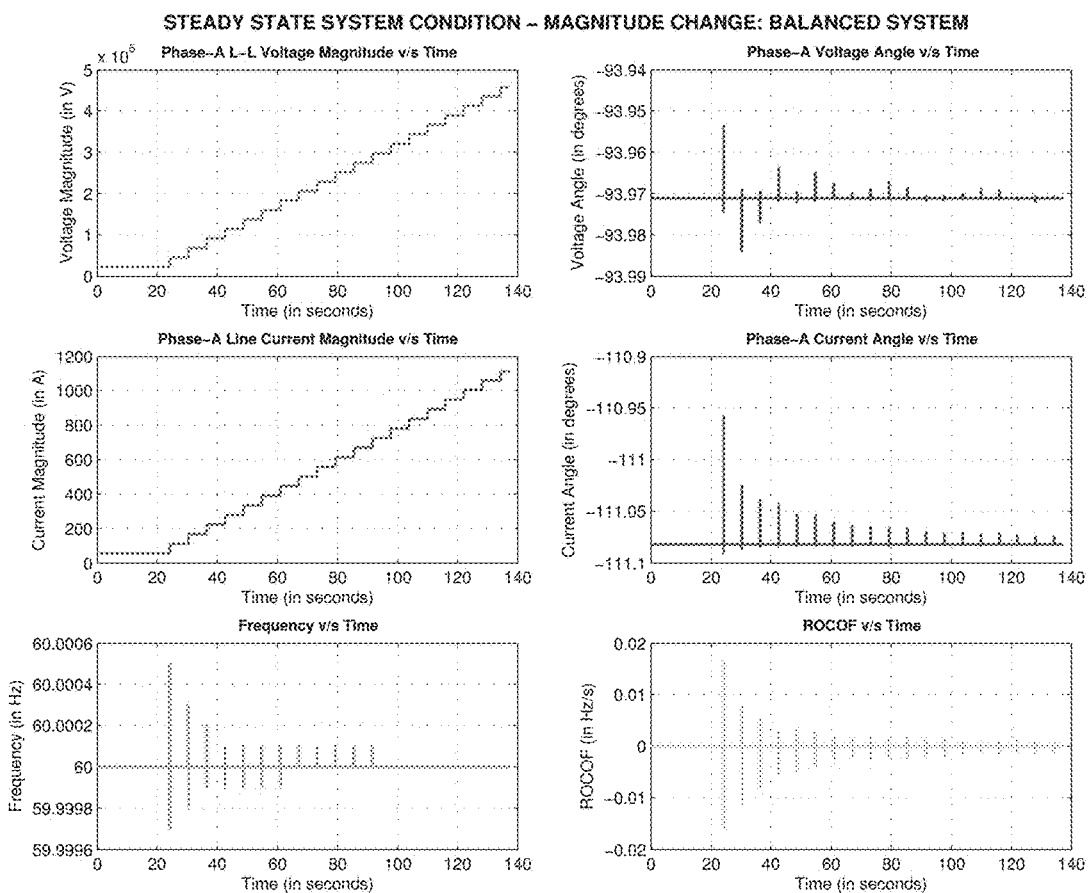
FIGS. 7A and 7B illustrate example steady state conditions of magnitude change in a balanced system and corresponding performance analysis results of an example power grid monitor in accordance with embodiments of the technology.
Figure 7B:
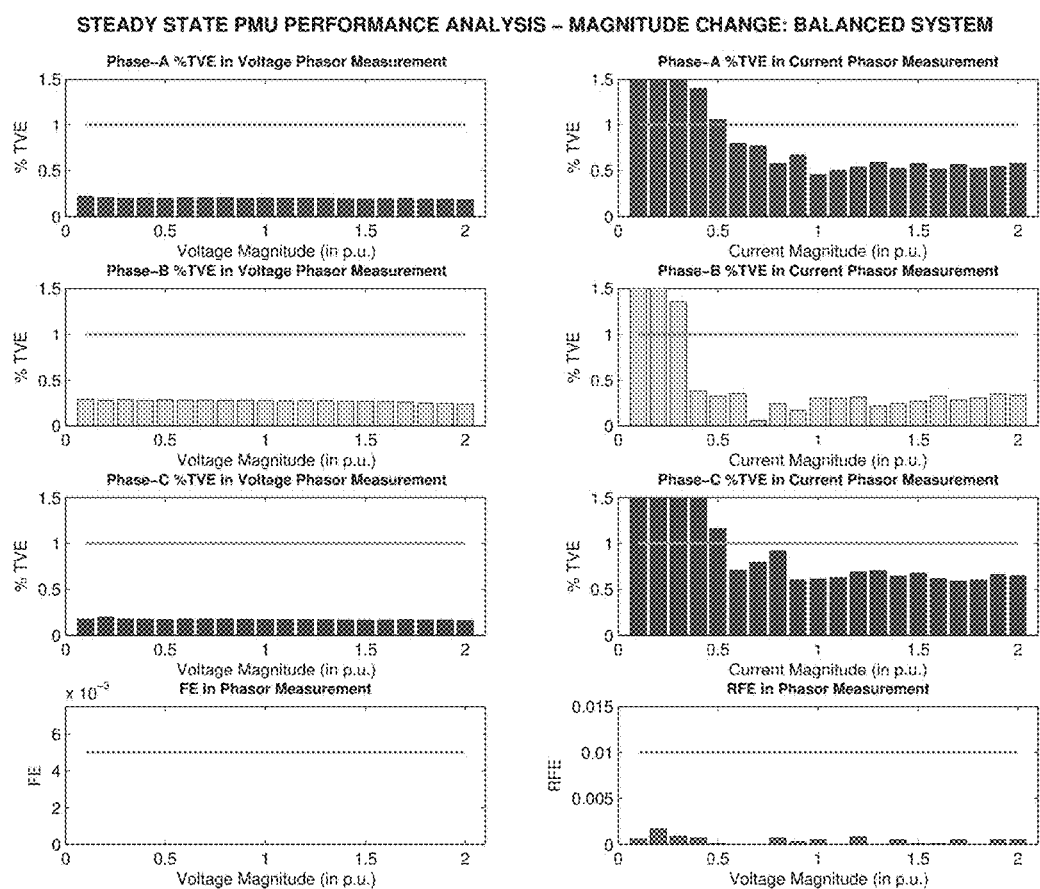
Figure 8A:
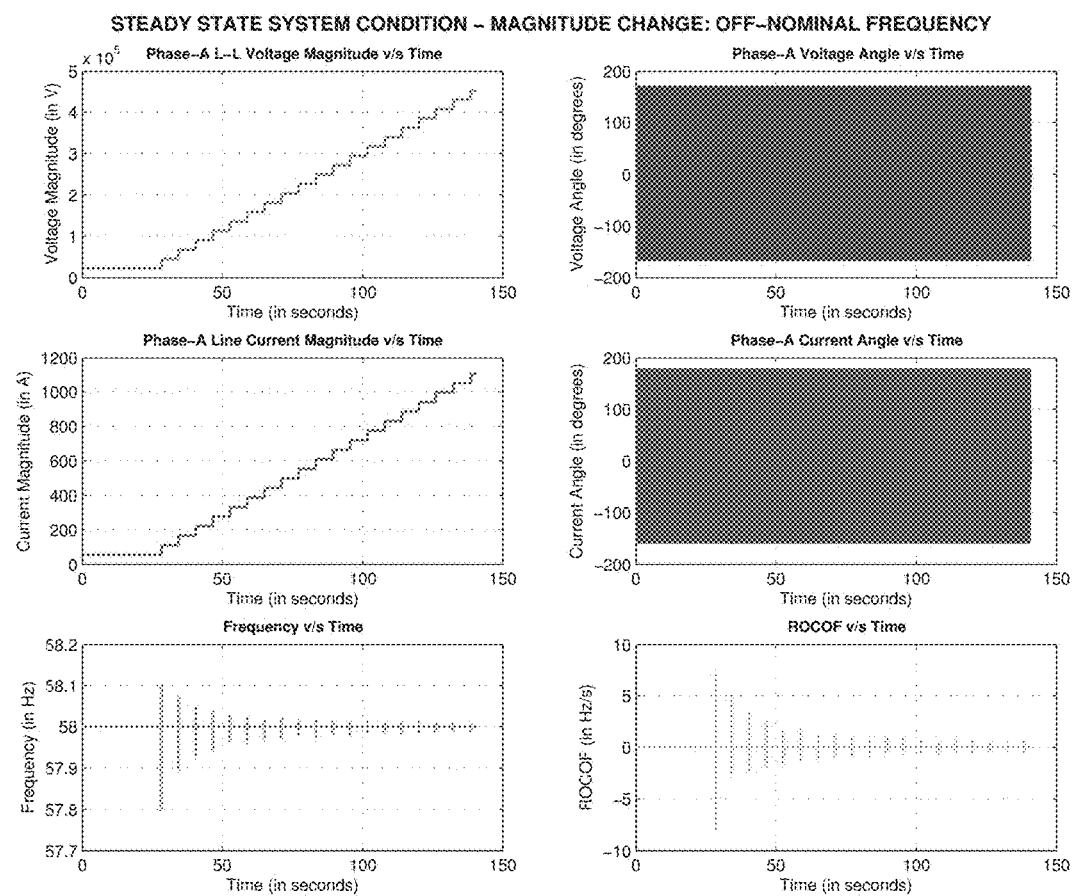
FIGS. 8A and 8B illustrate example steady state conditions of magnitude change with off-normal frequency and corresponding performance analysis results of an example power grid monitor in accordance with embodiments of the technology.
Figure 8B:
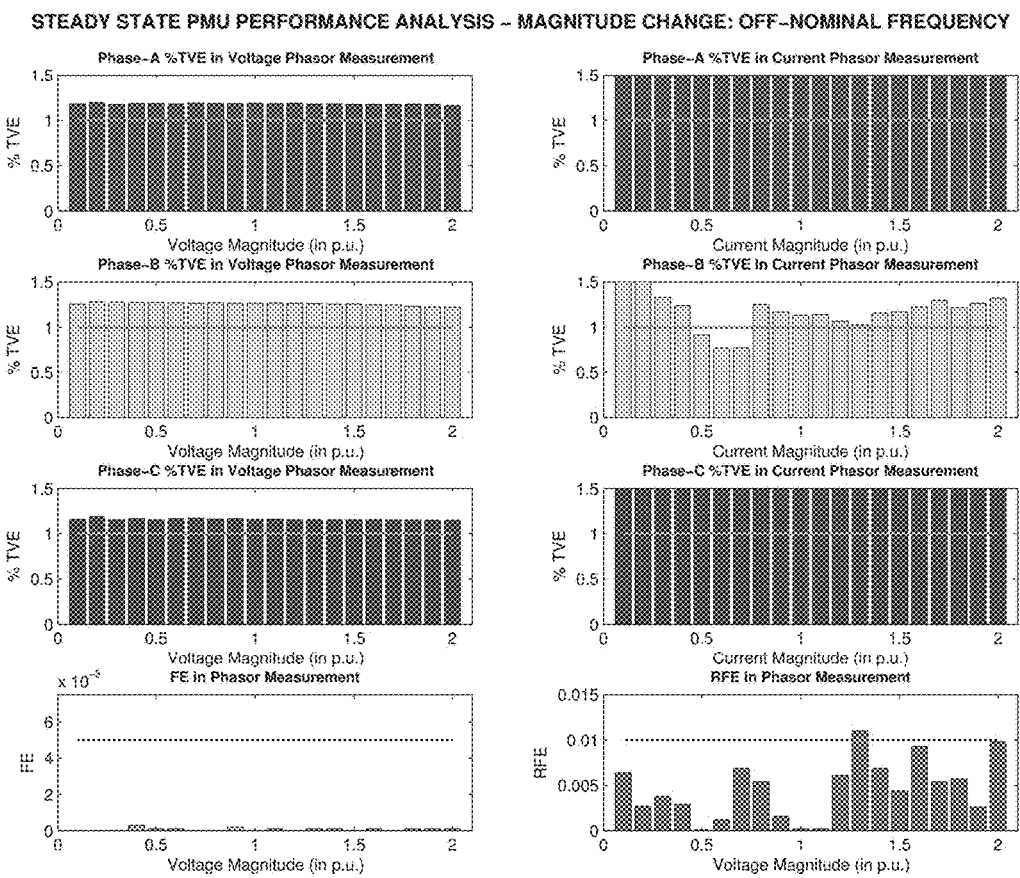
Figure 9A:
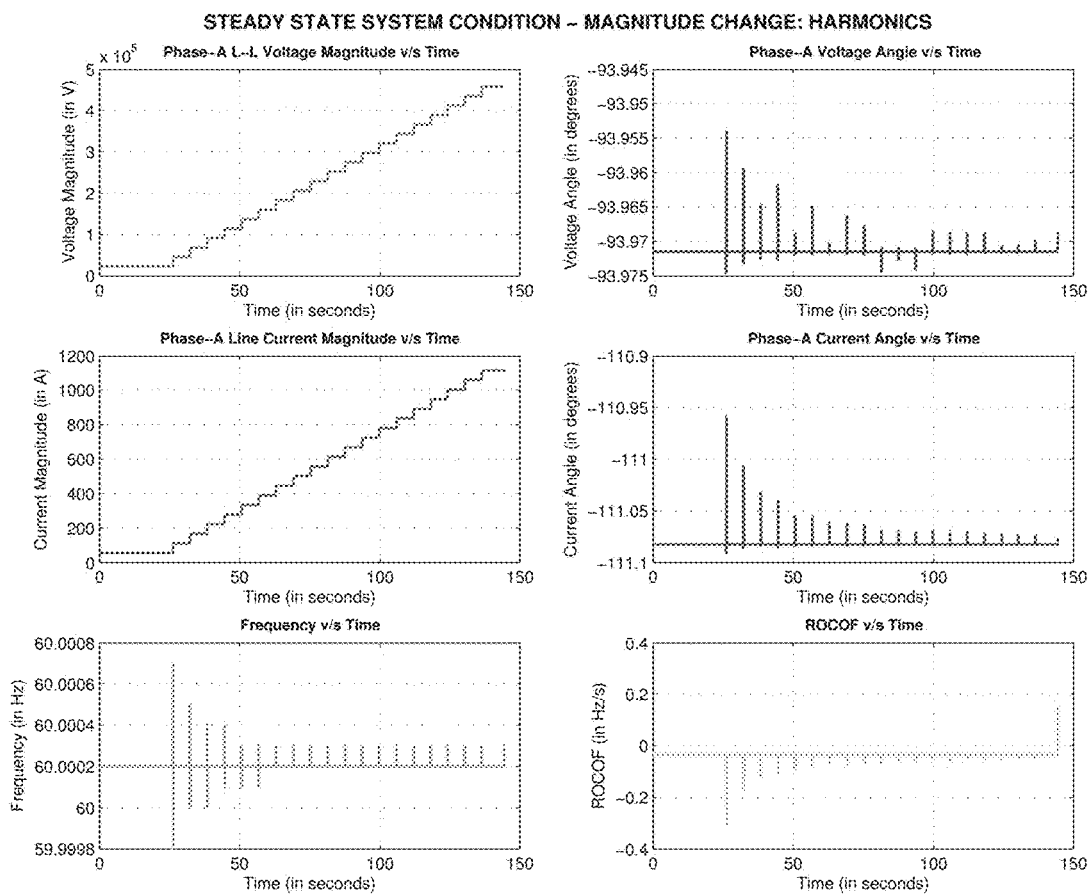
FIGS. 9A and 9B illustrate example steady state conditions of magnitude change with harmonics and corresponding performance analysis results of an example power grid monitor in accordance with embodiments of the technology.
Figure 9B:
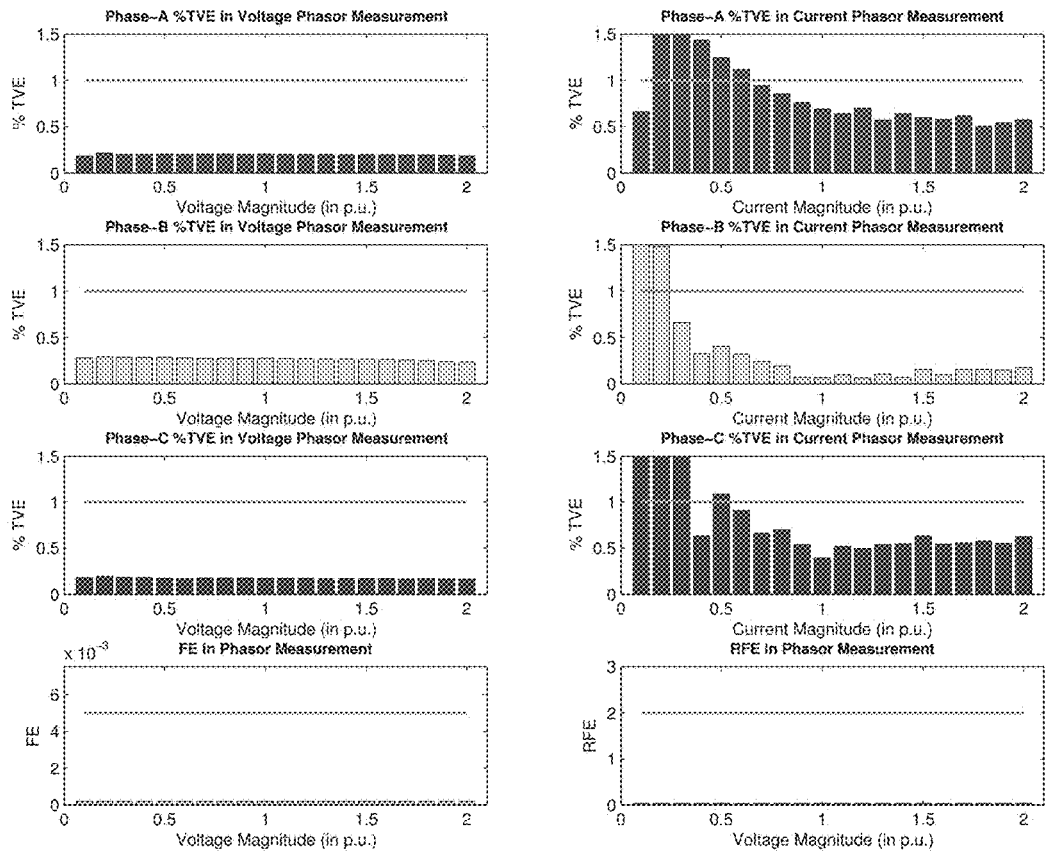
Figure 10A:
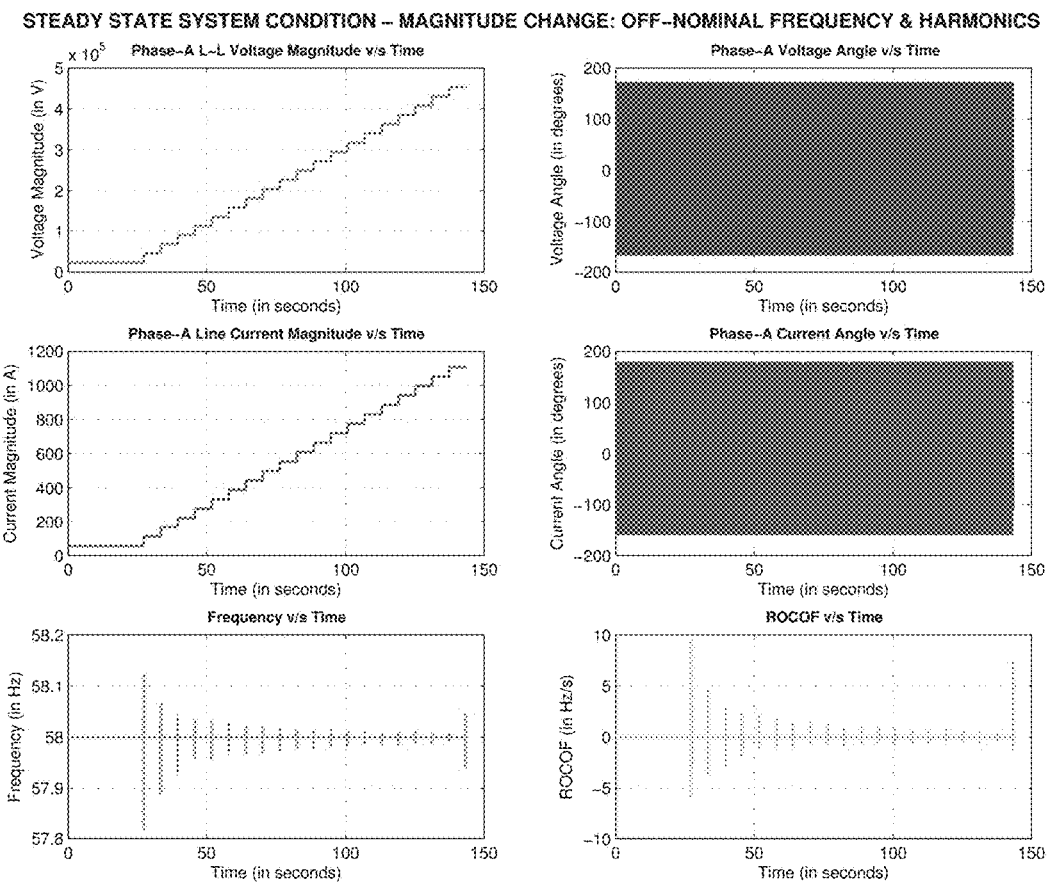
FIGS. 10A and 10B illustrate example steady state conditions of magnitude change with off-normal frequency and harmonics and corresponding performance analysis results of an example power grid monitor in accordance with embodiments of the technology.
Figure 10B:
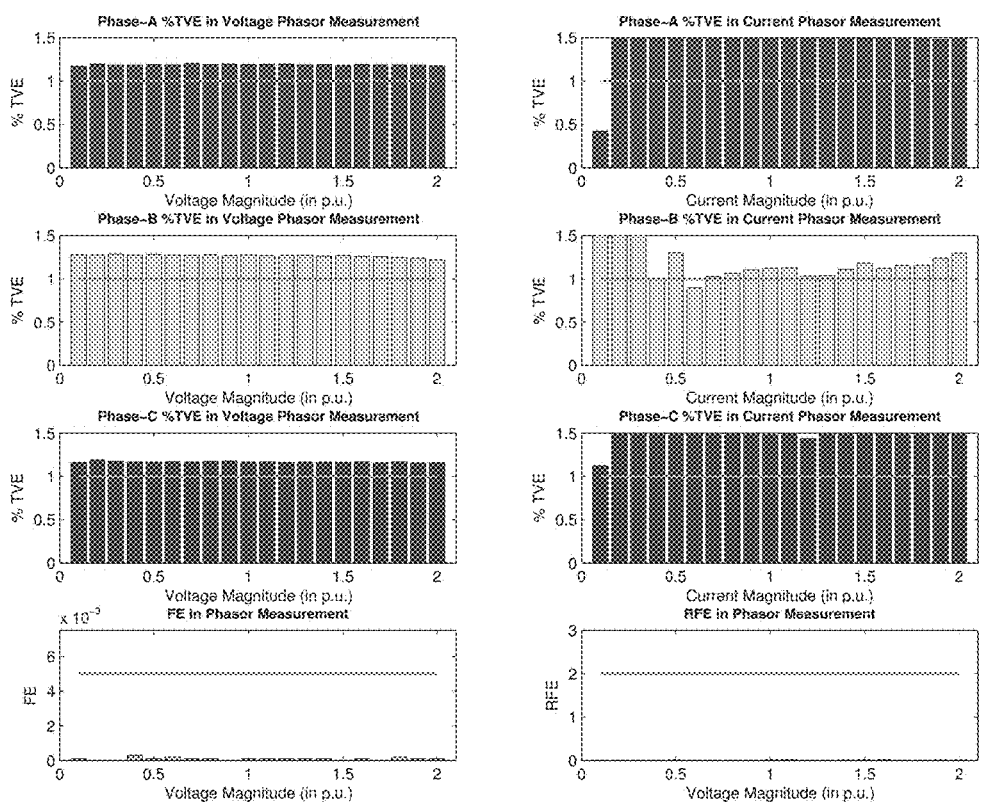

FIGS. 7A-11 show the generated test signals and the performance results when the voltage and current magnitudes are changed in steps of 0.1 p.u. from 0.1 p.u. to 2 p.u. for both the quantities, under various system conditions. For example, FIGS. 7A and 7B are related to a balanced system conditions with no harmonics and nominal system frequency of 60 Hz. FIGS. 8A and 8B are related to a system with off-normal frequency. FIGS. 9A and 9B are related to a system with harmonics. FIGS. 10A and 10B are related to a system with off-normal frequency and harmonics. Following are the observations that are made during the analysis of this test:

The voltage TVEs of all the 3 phases are much smaller than a threshold value of 1%.
The voltage TVEs of all the 3 phases are not the same.
The current TVEs of all the 3 phases are very high (above 1%) when the PMU measures current phasors far below the nominal current value. Gradually, as the current measurement approaches the nominal value, the TVEs decrease and go below the permissible threshold of 1%.

The current TVEs of all the 3 phases are not the same.

On the whole, current TVEs are found to be significantly higher than the voltage TVEs.

FE is much below the permissible threshold value.

RFE is also much below the allowed threshold value.

An extension of this test category has been done as the same magnitude change for voltage and current has also been performed under conditions when system is at off-nominal frequency of 58 Hz and when the system has harmonics of the order 3rd, 5th, 7th and 9th. Table 2 below shows the comparison of the different performance evaluation parameters of the PMU under test during different system conditions.

| Performance Evaluation Criteria | Balanced System at Nominal Frequency without Harmonics | Balanced System at Off-Nominal Frequency without Harmonics | Balanced System at Nominal Frequency with Harmonics | Allowable Values as per IEEE-C37.118.1 Standard (for reporting rate of 30 F/s) |
|---|---|---|---|---|
| Maximum Voltage TVE (in %) | 0.287 | 1.281 | 0.290 | 1 |
| Maximum Current TVE (in %) | 4.598 | 5.33 | 4.716 | 1 |
| Maximum FE (in %) | 0 | 0 | 0 | 0.005 |
| Maximum RFE (in %) | 0.002 | 0.011 | 0.035 | 0.01 |

Figure 11:
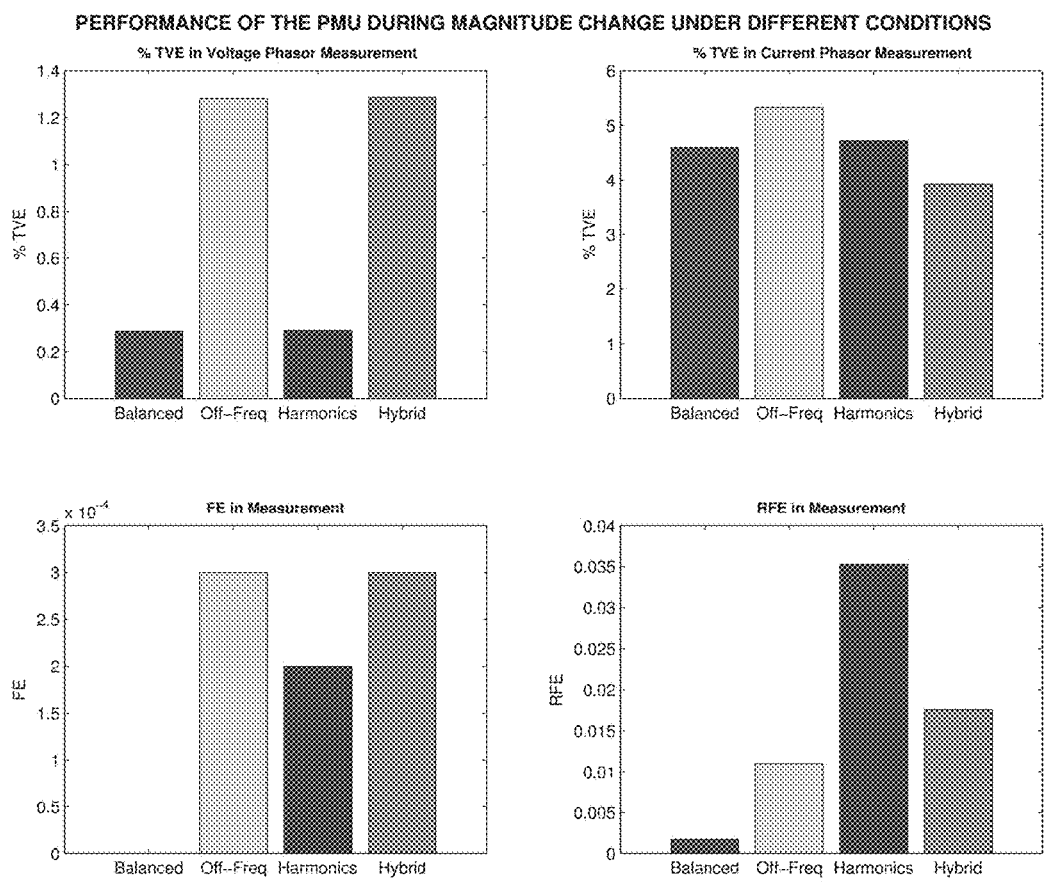
FIG. 11 illustrates example performance of the example power grid monitor during magnitude change in accordance with embodiments of the technology.

From Table 2 above, it can be seen that both voltage and current TVEs significantly increased when the system is at off-nominal frequency. Frequency error remained mostly unaffected during different system conditions. However, off-nominal frequency condition worsens the ROCOF error. While the presence of harmonics in the measured signal doesn't appreciably affect the phasor estimation algorithm, the ROCOF Error is significantly affected. FIG. 11 shows performance of the test PMU during magnitude change under different conditions.

Figure 12A:
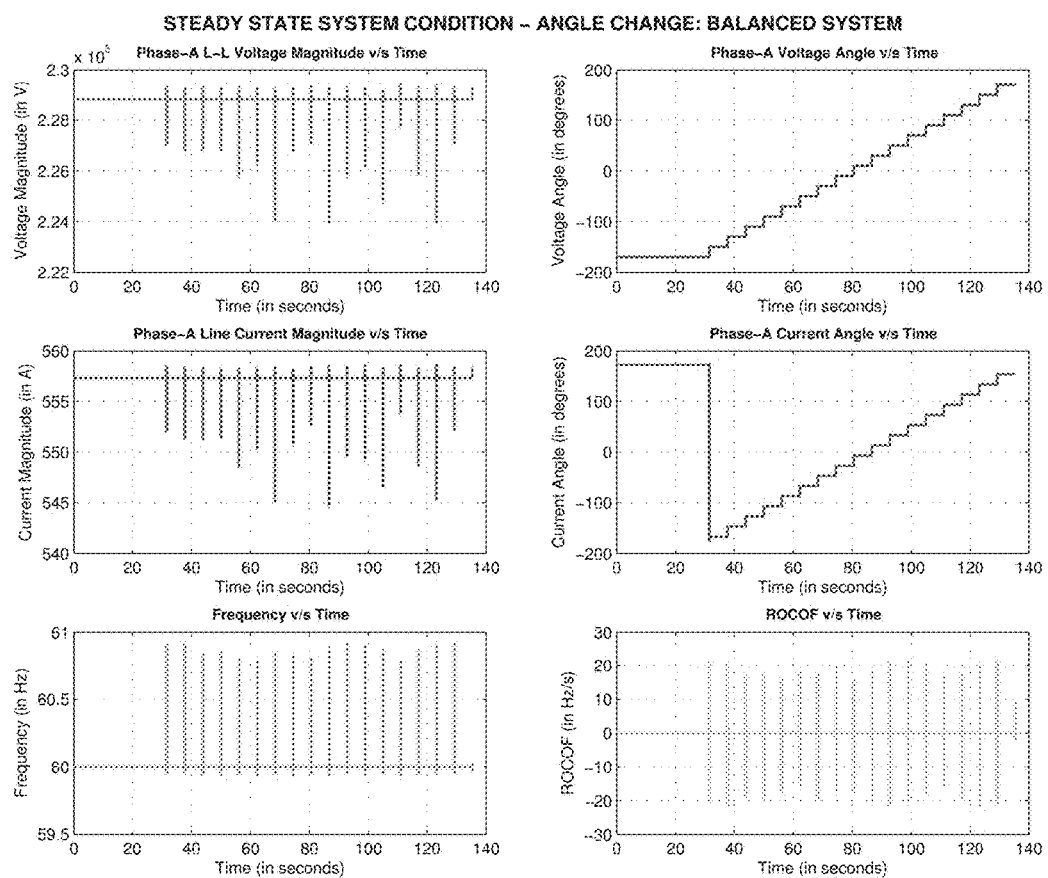
FIGS. 12A and 12B illustrate example steady state conditions of angle change in a balanced system and corresponding performance analysis results of an example power grid monitor in accordance with embodiments of the technology.
Figure 12B:
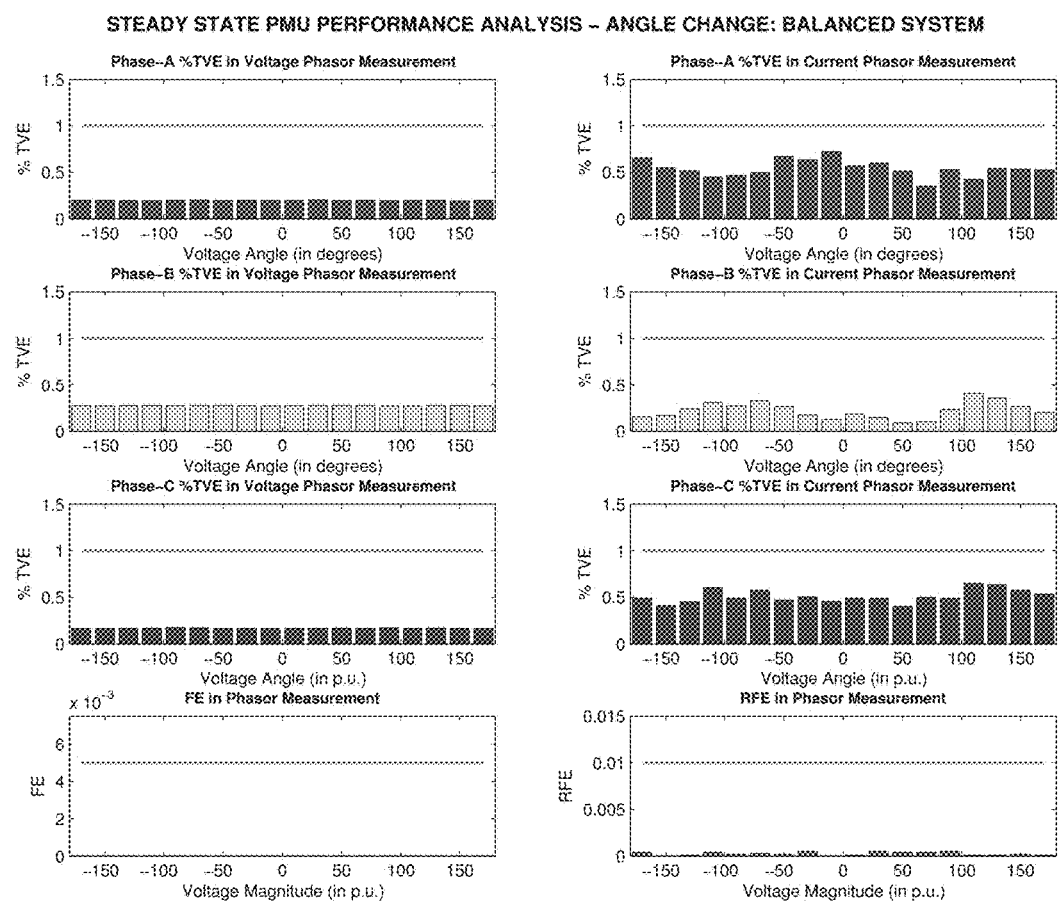
Figure 13A:
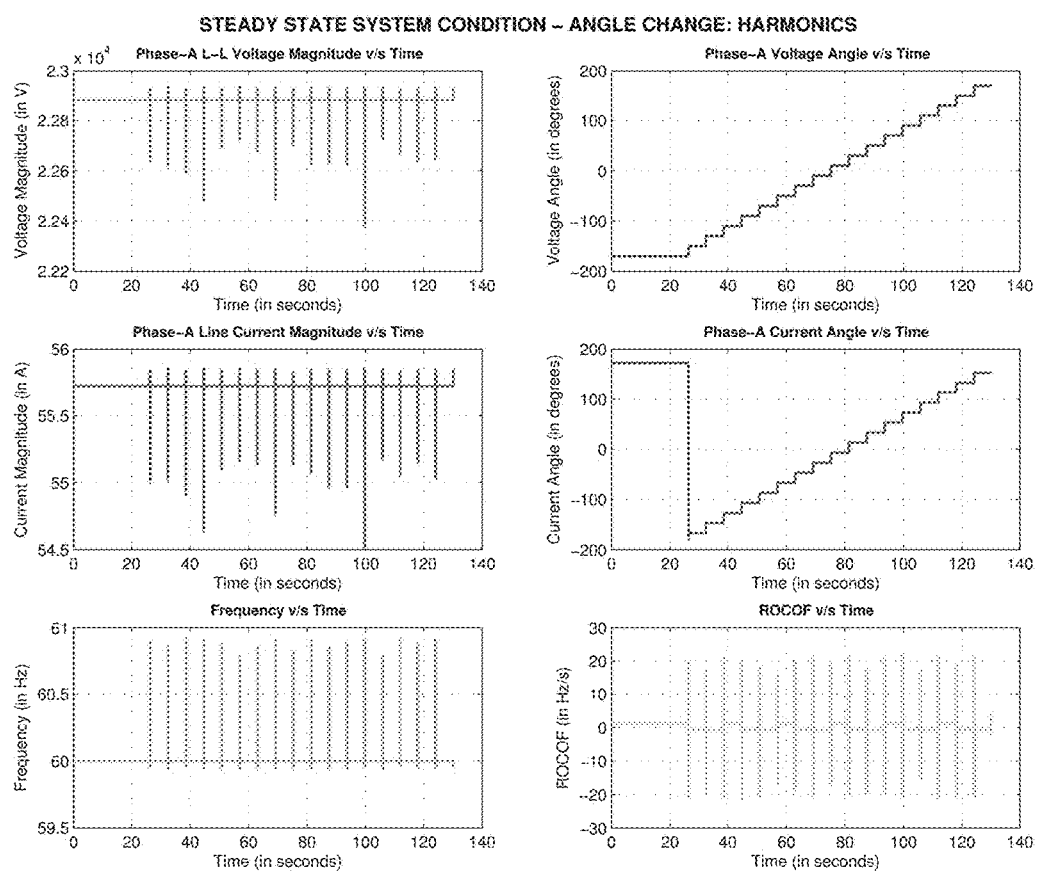
FIGS. 13A and 13B illustrate example steady state conditions of angle change with harmonics and corresponding performance analysis results of an example power grid monitor in accordance with embodiments of the technology.
Figure 13B:
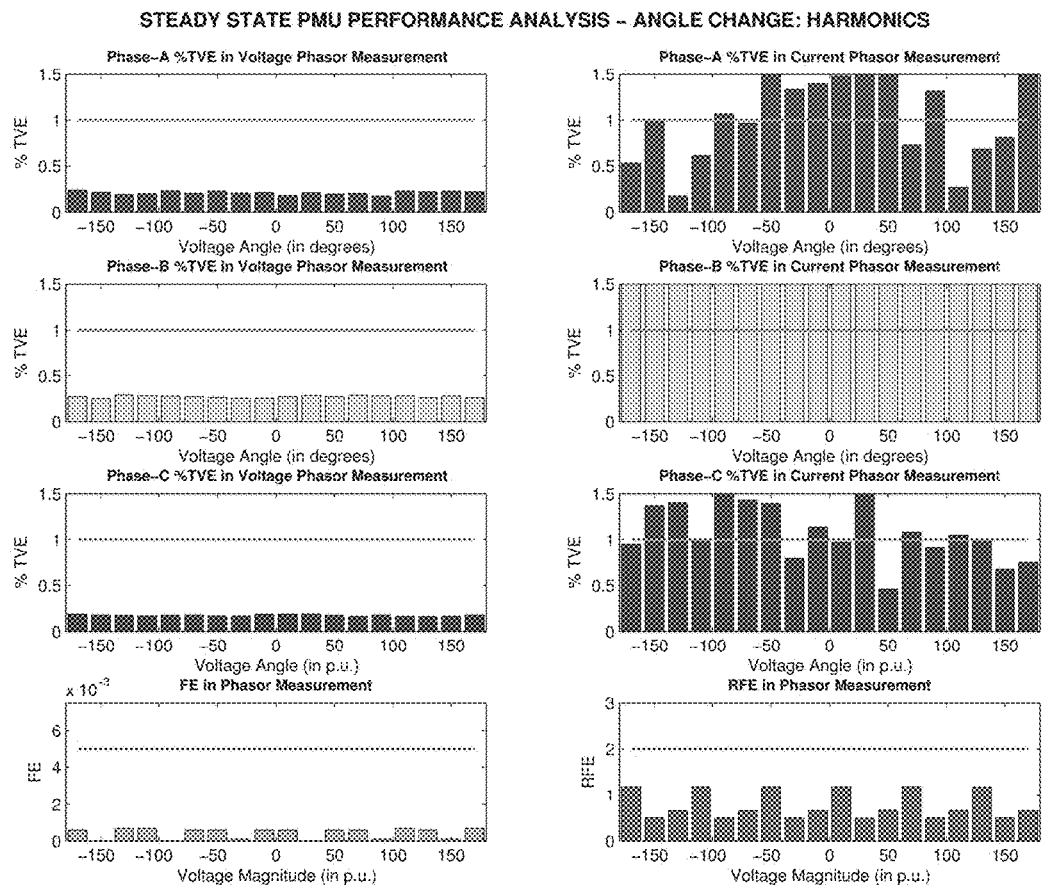
Figure 14:
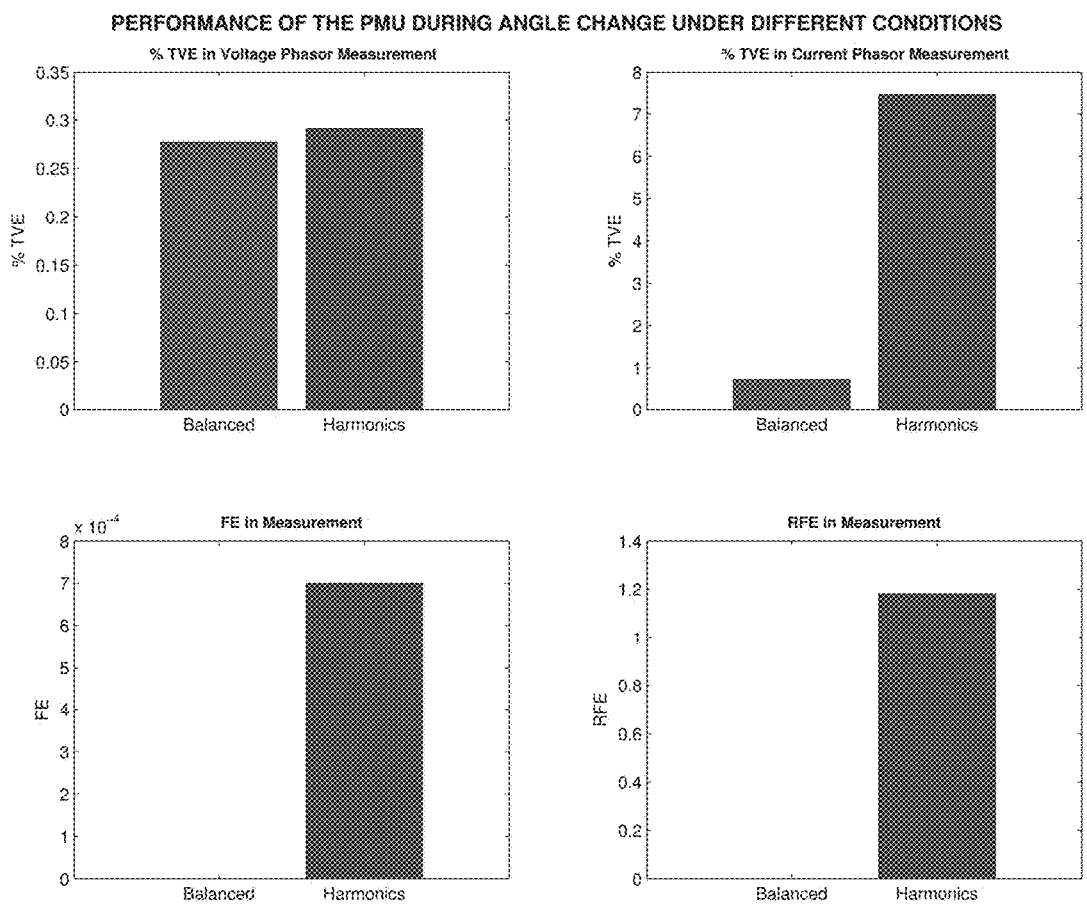
FIG. 14 illustrates example performance of the example power grid monitor during angle change in accordance with embodiments of the technology.

FIGS. 12A-14 show the generated test signals and the test results when the voltage and current angles are changed in steps of 10° between −180° and +180° for both the quantities, under various system conditions. For example, FIGS. 12A and 12B are related to balanced system conditions with no harmonics and nominal system frequency of 60 Hz. FIGS. 13A and 13B are related to a system having harmonics. FIG. 14 shows performance of the test PMU during angle change under different conditions. Following are the observations that are made during the analysis of this test:

The voltage TVEs of all the 3 phases are much less than a threshold of 1%.

The voltage TVEs of all the 3 phases are not the same.

The current TVEs of all the 3 phases are lesser than the permissible threshold of 1%.

The current TVEs of all the 3 phases are not the same.

On the whole, current TVEs are found to be higher than the voltage TVEs.

FE is much below the permissible threshold value.

RFE is also much below the allowed threshold value.

An extension of this test category has been done as the same angle change for voltage and current has also been performed under more realistic system conditions—when system has harmonics of the order 3rd, 5th, 7th and 9th. Table 3 below shows the comparison of the different performance evaluation parameters of the PMU under test during different system conditions.

| Performance Evaluation Criteria | Balanced System at Nominal Frequency without Harmonics | Balanced System at Nominal Frequency with Harmonics | Allowable Values as per IEEE-C37.118.1 Standard (for reporting rate of 30 F/s) |
|---|---|---|---|
| Maximum Voltage TVE (in %) | 0.277 | 0.291 | 1 |
| Maximum Current TVE (in %) | 0.720 | 7.466 | 1 |
| Maximum FE (in %) | 0 | 0.001 | 0.005 |
| Maximum RFE (in %) | 0.001 | 1.181 | 0.01 |

From Table 3 above, it can be seen that voltage TVE remains almost the same for systems with and without harmonics. However, the current TVEs significantly increased when the system has harmonics. Frequency error doesn't get affected appreciably when harmonics are present in the system, but there is a significant rise in the ROCOF Error when harmonics are present in the system.

Figure 15A:
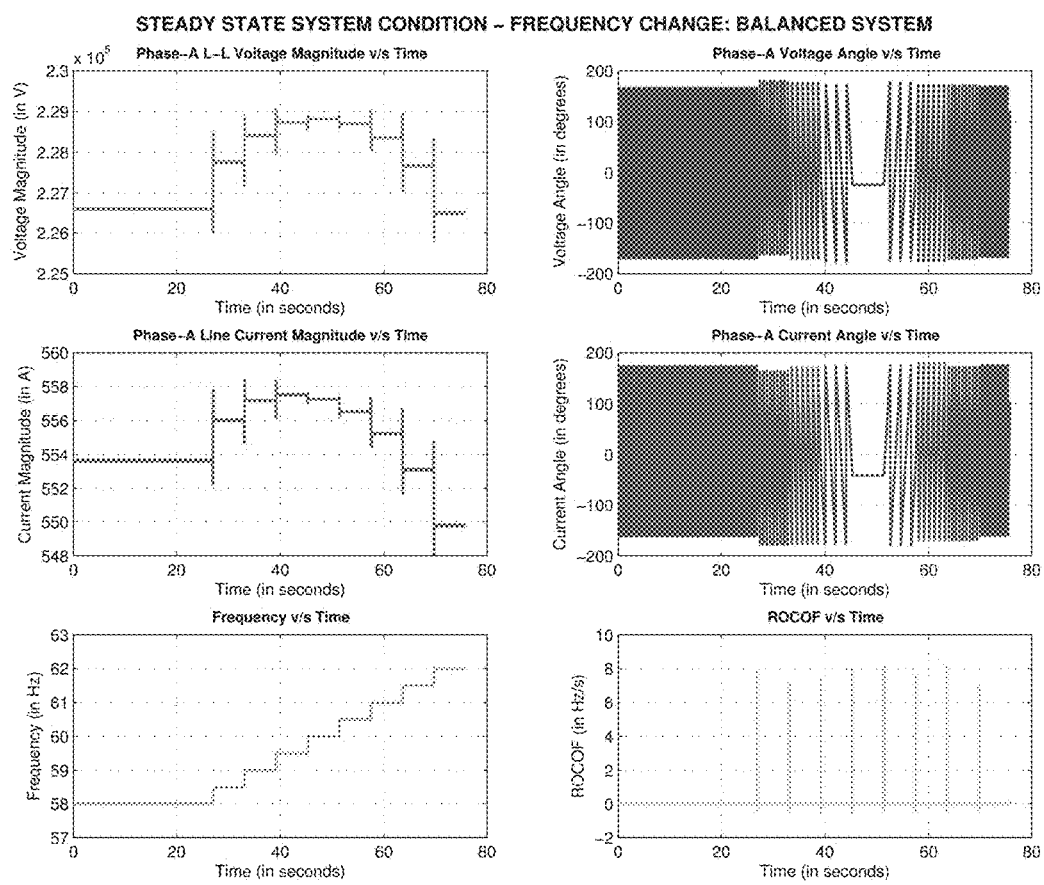
FIGS. 15A and 15B illustrate example steady state conditions of frequency change in a balanced system and corresponding performance analysis results of an example power grid monitor in accordance with embodiments of the technology.
Figure 15B:
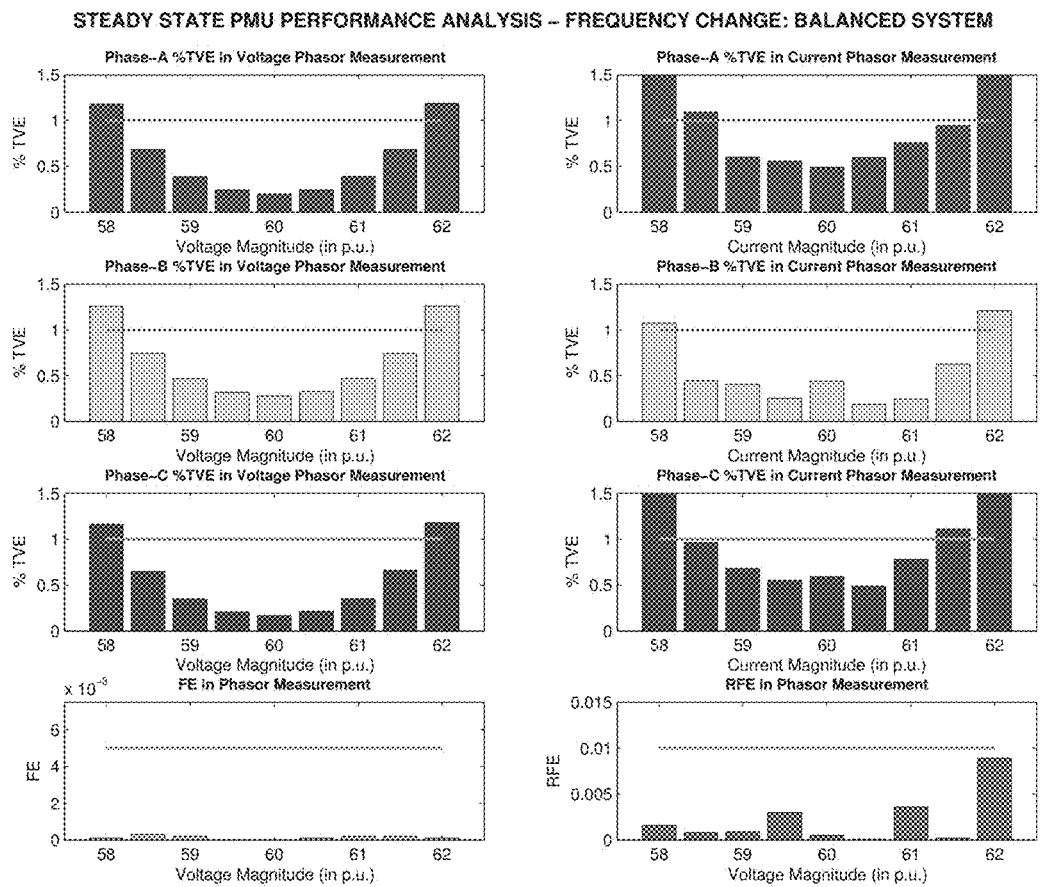
Figure 16A:
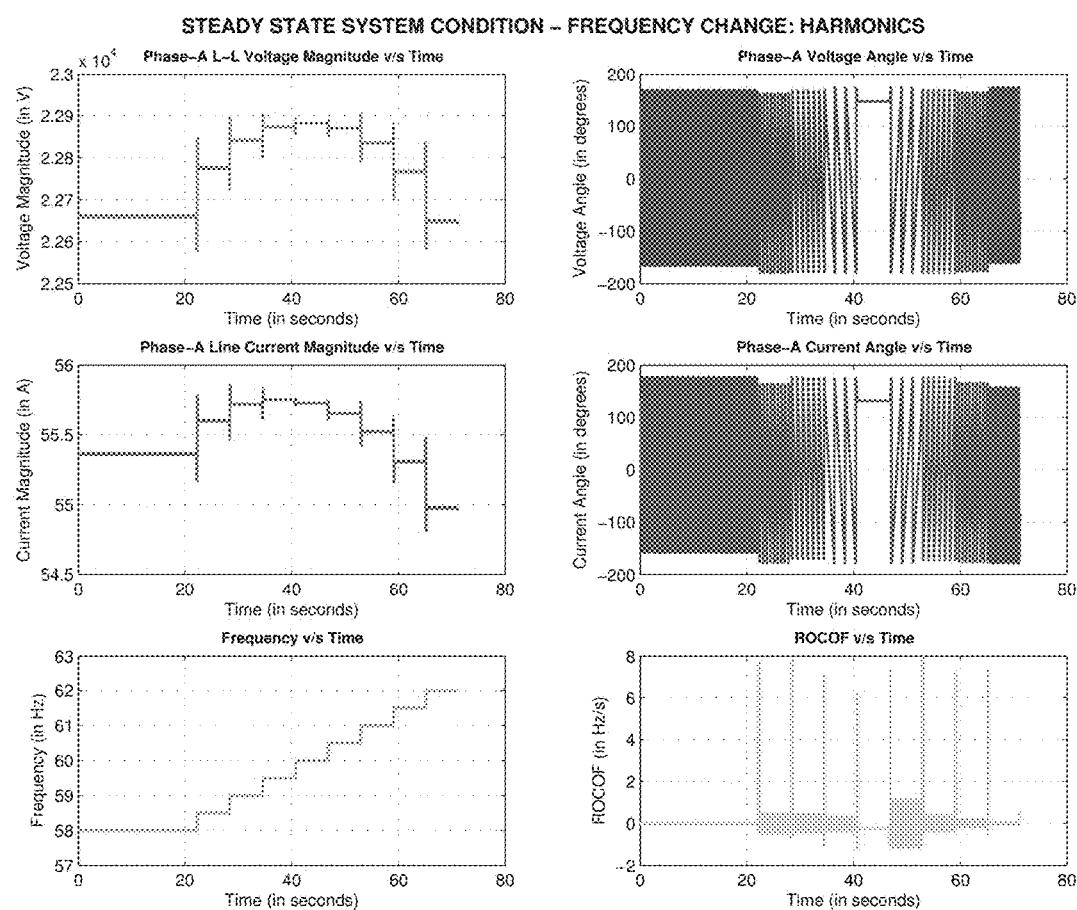
FIGS. 16A and 16B illustrate example steady state conditions of frequency change with harmonics and corresponding performance analysis results of an example power grid monitor in accordance with embodiments of the technology.
Figure 16B:
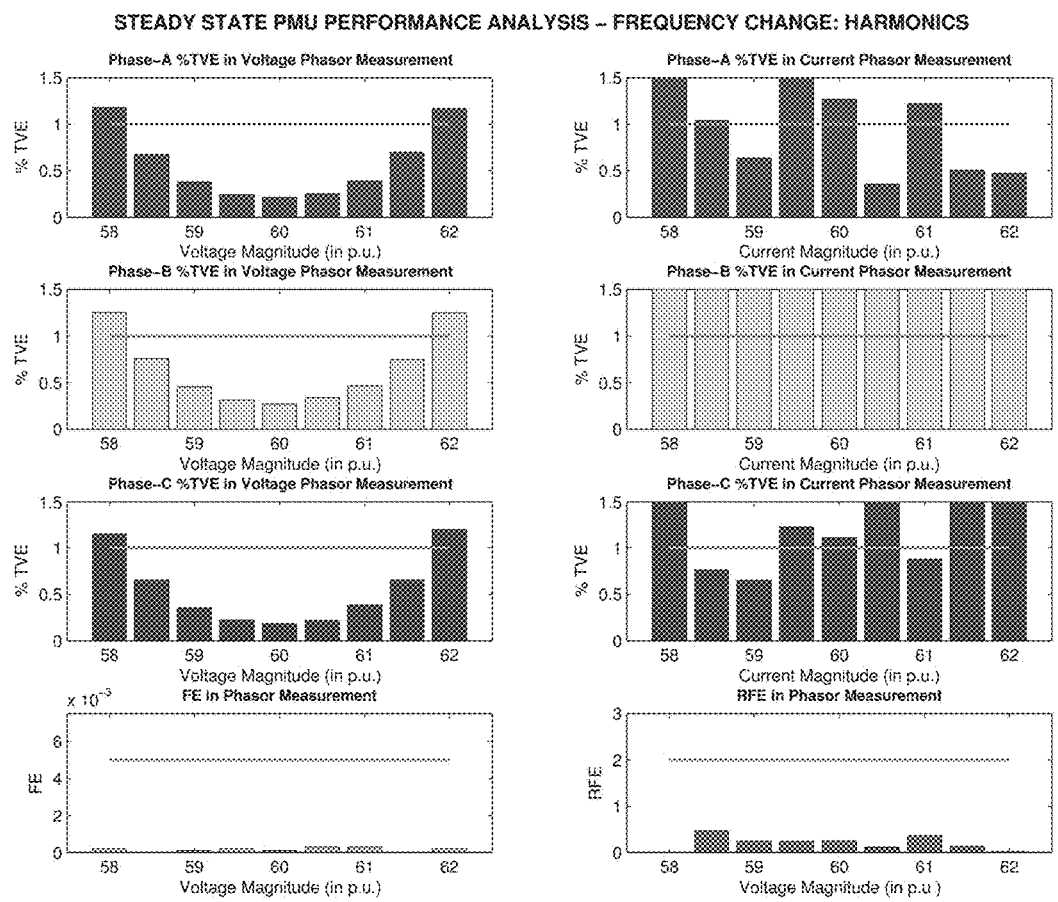
Figure 17:
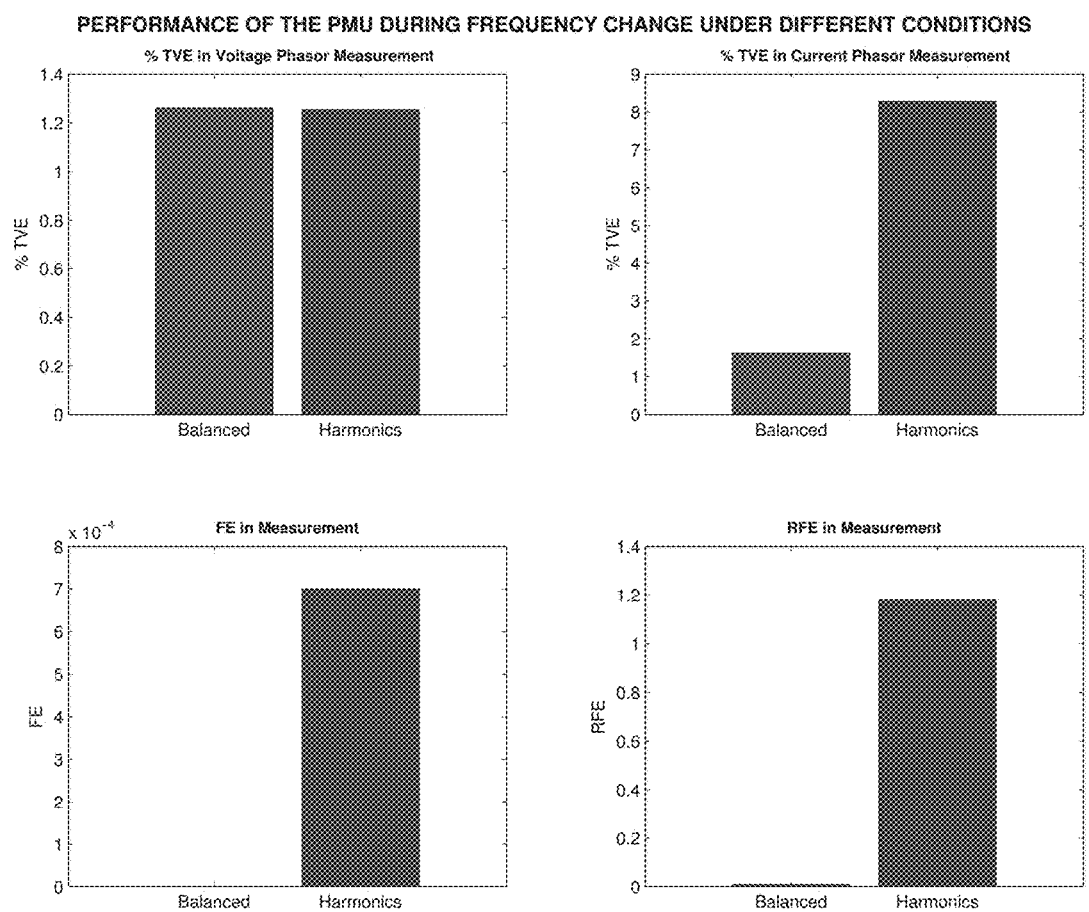
FIG. 17 illustrates example performance of the example power grid monitor during frequency change in accordance with embodiments of the technology.

FIGS. 15A-17 show the generated test signals and the test results when the frequency is changed in steps of 0.5 Hz between 58 Hz and 62 Hz, under various system conditions. For example, FIGS. 15A and 15B are related to balanced system conditions with no harmonics. FIGS. 16A and 16B are related to a system with harmonics. Following are the observations that are made during the analysis of this test:

The voltage TVEs of all the 3 phases are much less than the threshold value of 1% when the system is at nominal frequency (60 Hz). However, as the system frequency moves away from the nominal value both, above and below, the TVEs start increasing rapidly. It can be seen that at 58 Hz and 62 Hz, the voltage TVEs exceed the threshold value of 1%.

The voltage TVEs of all the 3 phases are not the same.

The current TVEs of all the 3 phases are lesser than the threshold value of 1% when the system is at nominal frequency (60 Hz). However, as the system frequency moves away from the nominal value both, above and below, the TVEs start increasing rapidly. It can be seen that at 58 Hz and 62 Hz, the current TVEs exceed the threshold value of 1%.

The current TVEs of all the 3 phases are not the same.

On the whole, current TVEs are found to be higher than the voltage TVEs.

FE is much below the permissible threshold value.

RFE is also below the allowed threshold value.

An extension of this test category has been done as the same frequency change for voltage and current has also been performed under more realistic system conditions—when system has harmonics of the order 3rd, 5th, 7th and 9th. Table 4 below shows the comparison of the different performance evaluation parameters of the PMU under test during different system conditions.

| Performance Evaluation Criteria | Balanced System at Nominal Frequency without Harmonics | Balanced System at Nominal Frequency with Harmonics | Allowable Values as per IEEE-C37.118.1 Standard (for reporting rate of 30 F/s) |
|---|---|---|---|
| Maximum Voltage TVE (in %) | 1.262 | 1.254 | 1 |
| Maximum Current TVE (in %) | 1.622 | 8.282 | 1 |
| Maximum FE (in %) | 0 | 0 | 0.005 |
| Maximum RFE (in %) | 0.009 | 0.466 | 0.01 |

Figure 18:
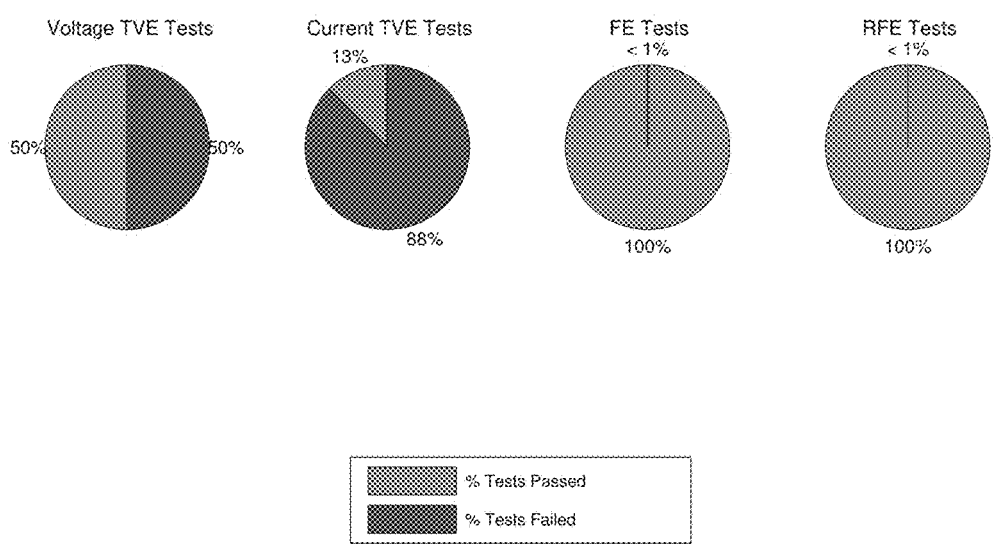
FIG. 18 illustrates example overall performance of the example power grid monitor in accordance with embodiments of the technology.

From Table 4 above, it can be seen that voltage TVE remains almost the same for systems with and without harmonics. However, the current TVEs significantly shoot up when the system has harmonics. Frequency error doesn't get affected appreciably when harmonics are present in the system, but there is a significant rise in the ROCOF Error when harmonics are present in the system. FIG. 18 shows overall steady state performance of the PMU.

Discussion on Dynamic Tests

Figure 19A:
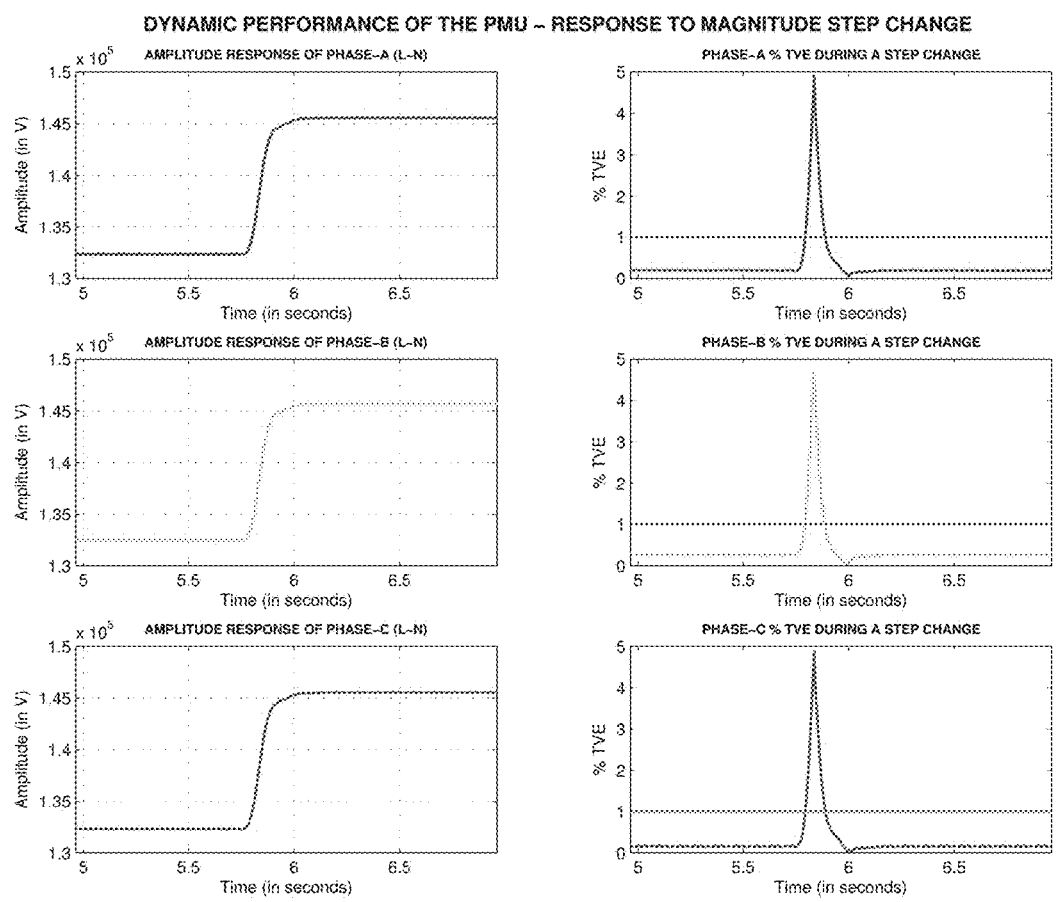
FIGS. 19A-19D illustrate example dynamic performance of an example power grid monitor in response to a magnitude step chance, angle step change, frequency step change, and frequency ramp change, respectively, in accordance with embodiments of the technology.

FIG. 19A shows the response of the test PMU when the measured voltage magnitude is changed by 10%. Table 5 below shows the values of the different performance evaluation metrics computed during the analysis of this step change.

| Evaluation Parameters | Results of the Test PMU | Allowable Values as per IEEE-C37.118.1 Standard (for reporting rate of 30 F/s) |
|---|---|---|
| Response Time (in seconds) | 0.093 | 0.182 |
| Delay Time (in seconds) | 0.065 | 0.008 |
| Peak Overshoot (in %) | 0.279 | 10 |

From the results shown in Table 5 above, it can be seen that the PMU under test meets the requirement of response time and peak overshoot, but fails to meet the requirement of delay time.

Figure 19B:
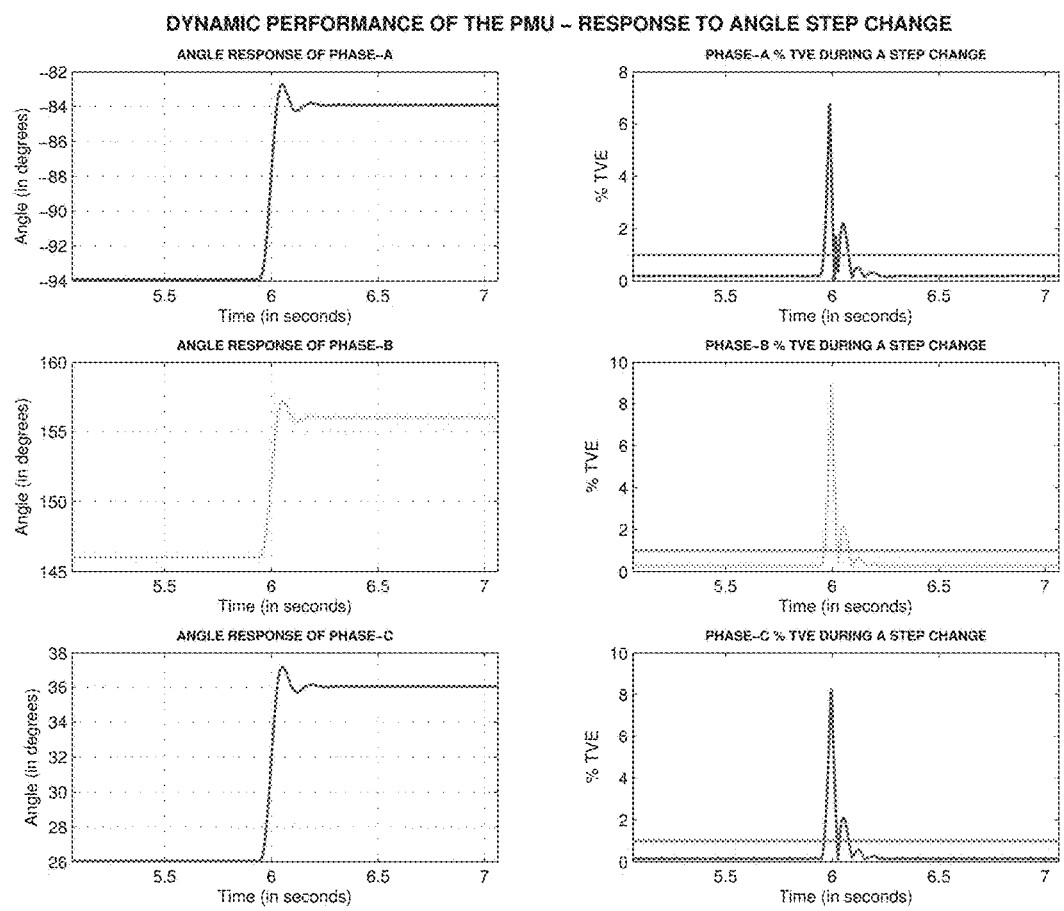

FIG. 19B shows the response of the test PMU when the measured voltage angle is changed by 10°. Table 6 below shows the values of the different performance evaluation metrics computed during the analysis of this step change.

| Evaluation Parameters | Results of the Test PMU | Allowable Values as per IEEE-C37.118.1 Standard (for reporting rate of 30 F/s) |
|---|---|---|
| Response Time (in seconds) | 0.113 | 0.182 |
| Delay Time (in seconds) | 0.045 | 0.008 |
| Peak Overshoot (in %) | 2.561 | 10 |

From the results in Table 6, it can be seen that the PMU under test meets the requirement of response time and peak overshoot, but fails to meet the requirement of delay time.

Figure 19C:
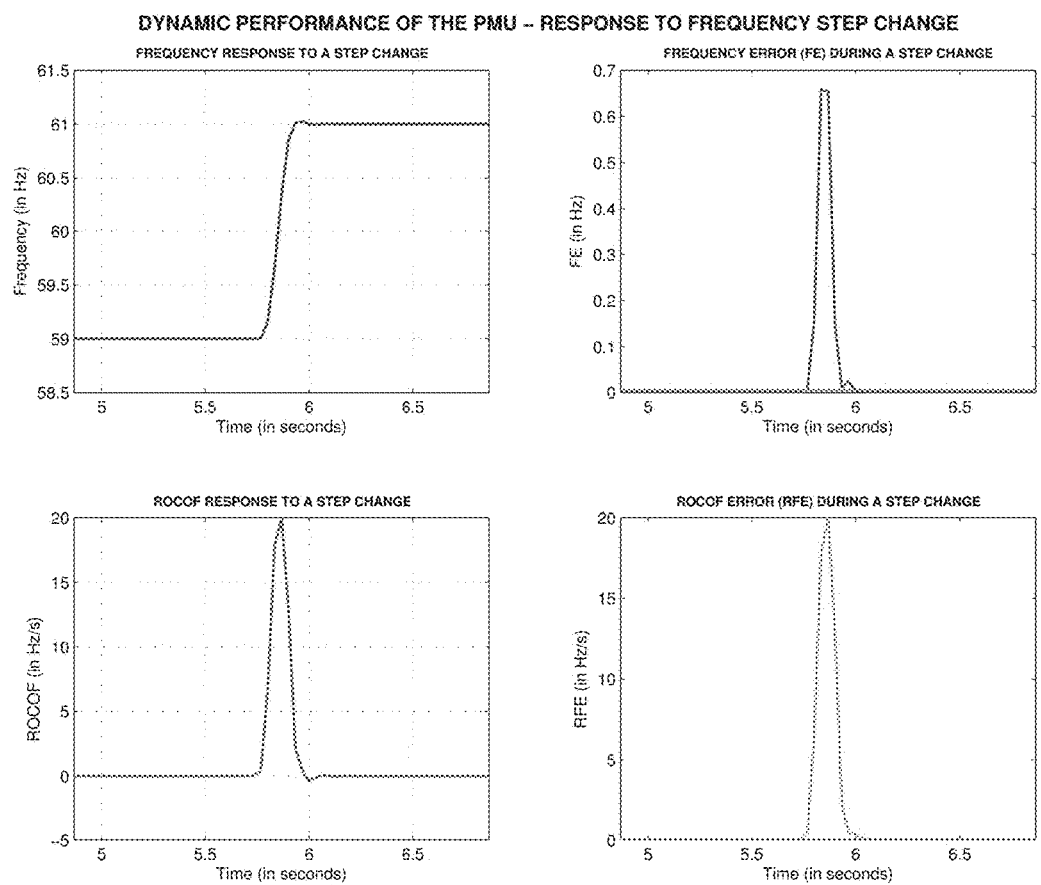

FIG. 19C shows the response of the test PMU when the measured frequency is changed by 2 Hz. Table 7 shows the values of the different performance evaluation metrics computed during the analysis of this step change.

| Evaluation Parameters | Results of the Test PMU | Allowable Values as per IEEE-C37.118.1 Standard (for reporting rate of 30 F/s) |
|---|---|---|
| Frequency Response Time (in seconds) | 0.267 | 0.305 |
| ROCOF Response Time (in seconds) | 0.4 | 0.314 |
| Delay Time (in seconds) | 0.08 | 0.008 |
| Peak Overshoot (in %) | 0.042 | 10 |

From the results shown in Table 7 above, it can be seen that the PMU under test meets the requirement of frequency response time and peak overshoot, but fails to meet the requirement of ROCOF response time and delay time.

Figure 19D:
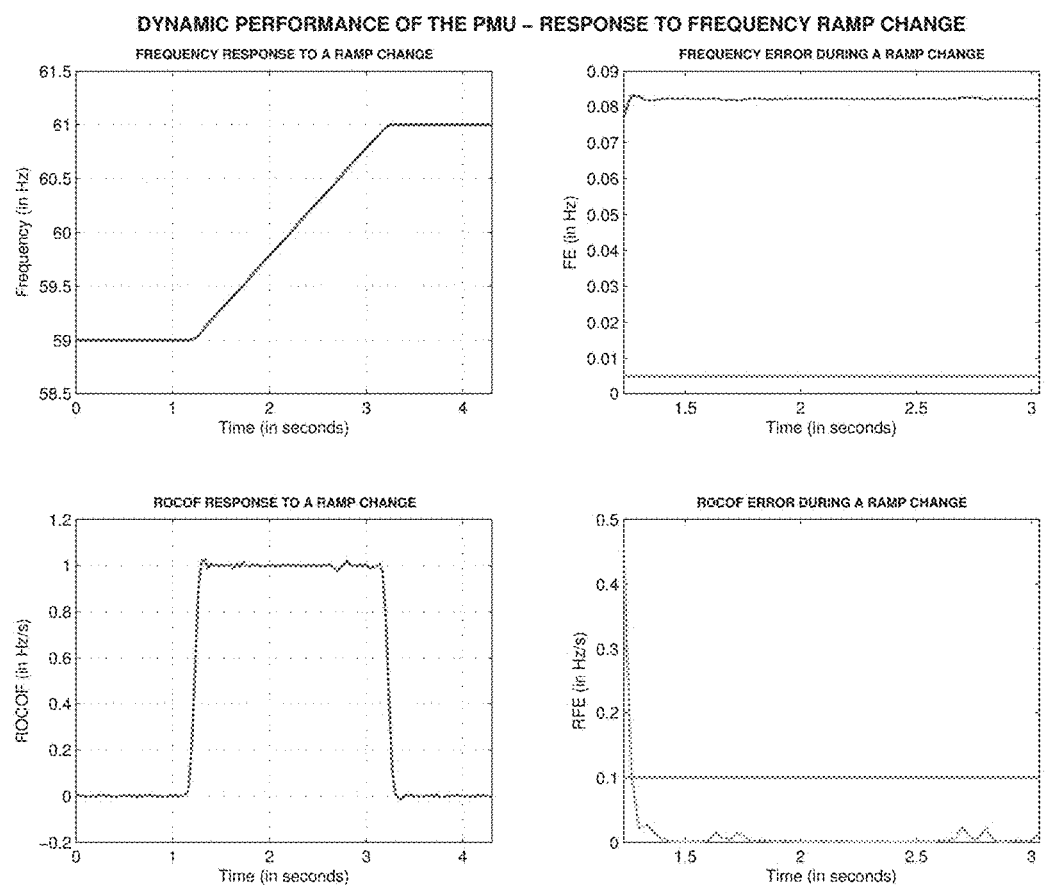

FIG. 19D shows the response of the test PMU when the measured frequency is changed by 2 Hz at the rate of 1 Hz/s. Table 8 below shows the values of the different performance evaluation metrics computed during the analysis of this step change.

| Evaluation Parameters | Results of the Test PMU | Allowable Values as per IEEE-C37.118.1 Standard (for reporting rate of 30 F/s) |
|---|---|---|
| Maximum FE (in Hz) | 0.083 | 0.005 |
| Maximum RFE (in Hz/s) | 0.457 | 0.1 |

From the results in Table 8 above, it can be seen that the PMU under test fails to meet the requirement of both maximum frequency error and maximum ROCOF error.

Figure 20A:
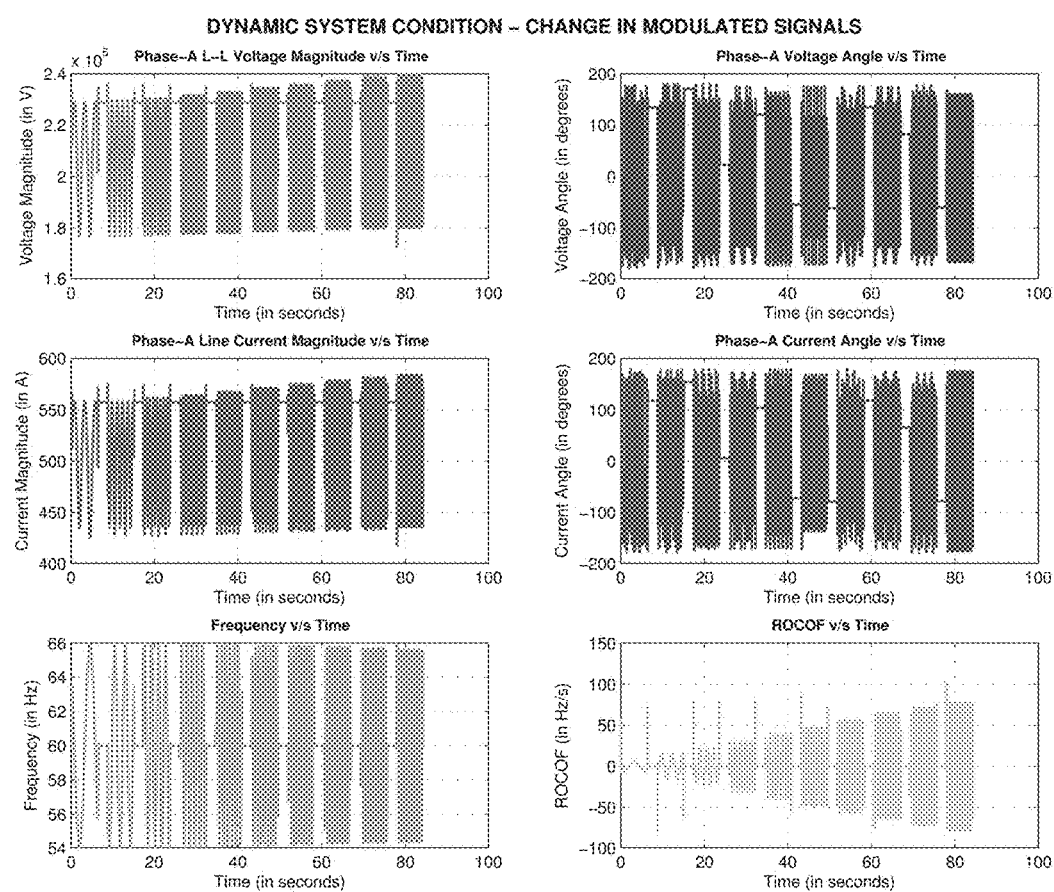
FIGS. 20A and 20B illustrate example dynamic conditions of a change in modulated signals and corresponding performance analysis results of an example power grid monitor in accordance with embodiments of the technology.
Figure 20B:
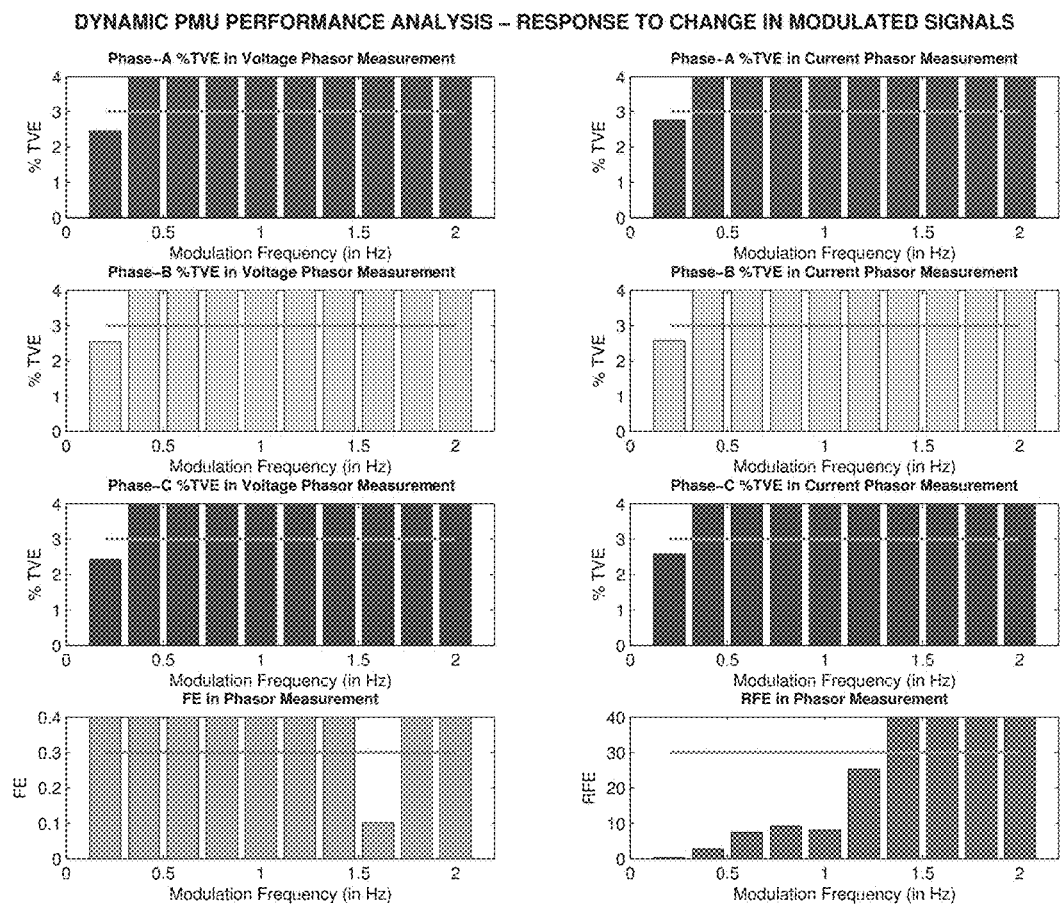

FIGS. 20A and 20B show the generated test signals and the test results when the frequency modulation is changed from 0.1 Hz to 2 Hz, with amplitude modulation factor of 0.1 and phase modulation factor of 0.1 radian, under balanced system conditions with no harmonics. Following are the observations that are made during the analysis of this test:

The voltage TVEs of all the 3 phases are much higher than a threshold value of 1%.

The voltage TVEs of all the 3 phases are not the same.

The current TVEs of all the 3 phases are much higher than the threshold value of 1%.

The current TVEs of all the 3 phases are not the same.

On the whole, current TVEs are found to be higher than the voltage TVEs.

FE is much higher than the permissible threshold value.

RFE is initially below the allowed threshold limit. But as the frequency modulation increases, the RFE goes on increasing rapidly, and exceeds the allowed threshold value.

Figure 21A:
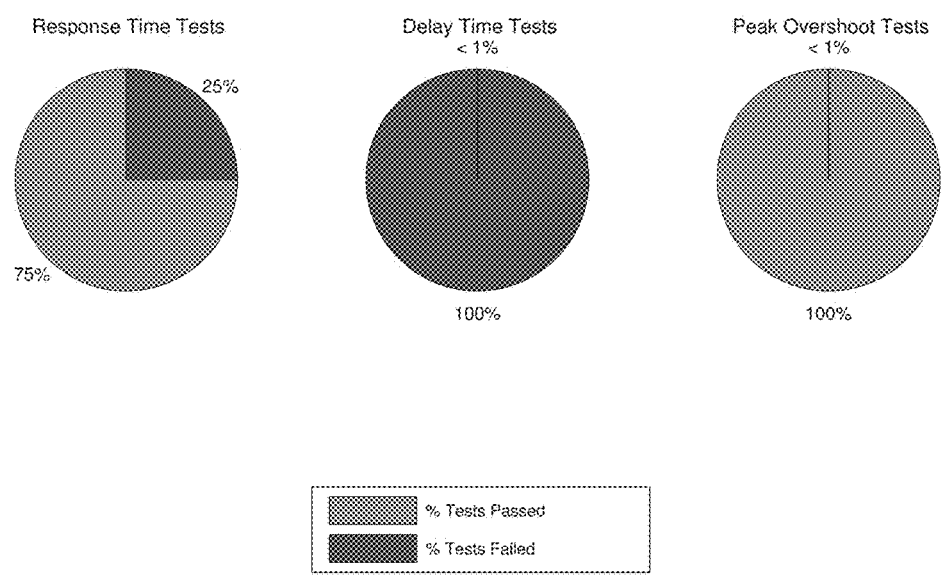
FIGS. 21A-21C illustrate example dynamic performance of an example power grid monitor in accordance with embodiments of the technology.
Figure 21B:
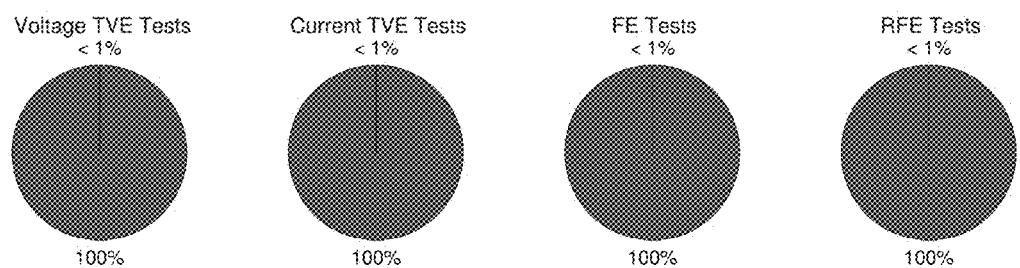
Figure 21B:
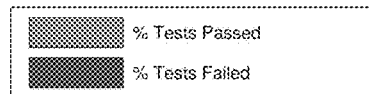
Figure 21C:
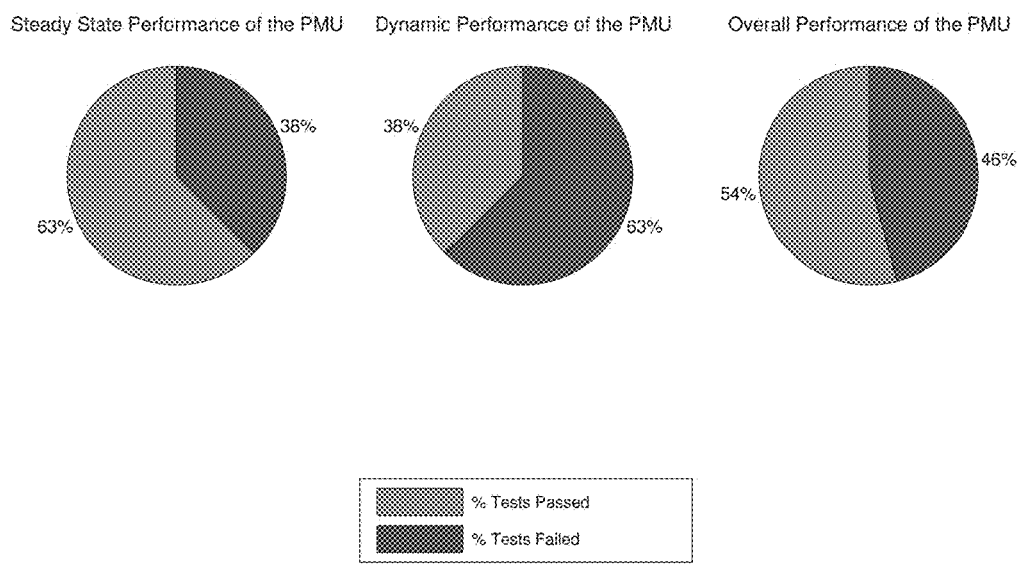

FIGS. 21A-21C show various test results of overall dynamic performance of the test PMU.

Figure 22:
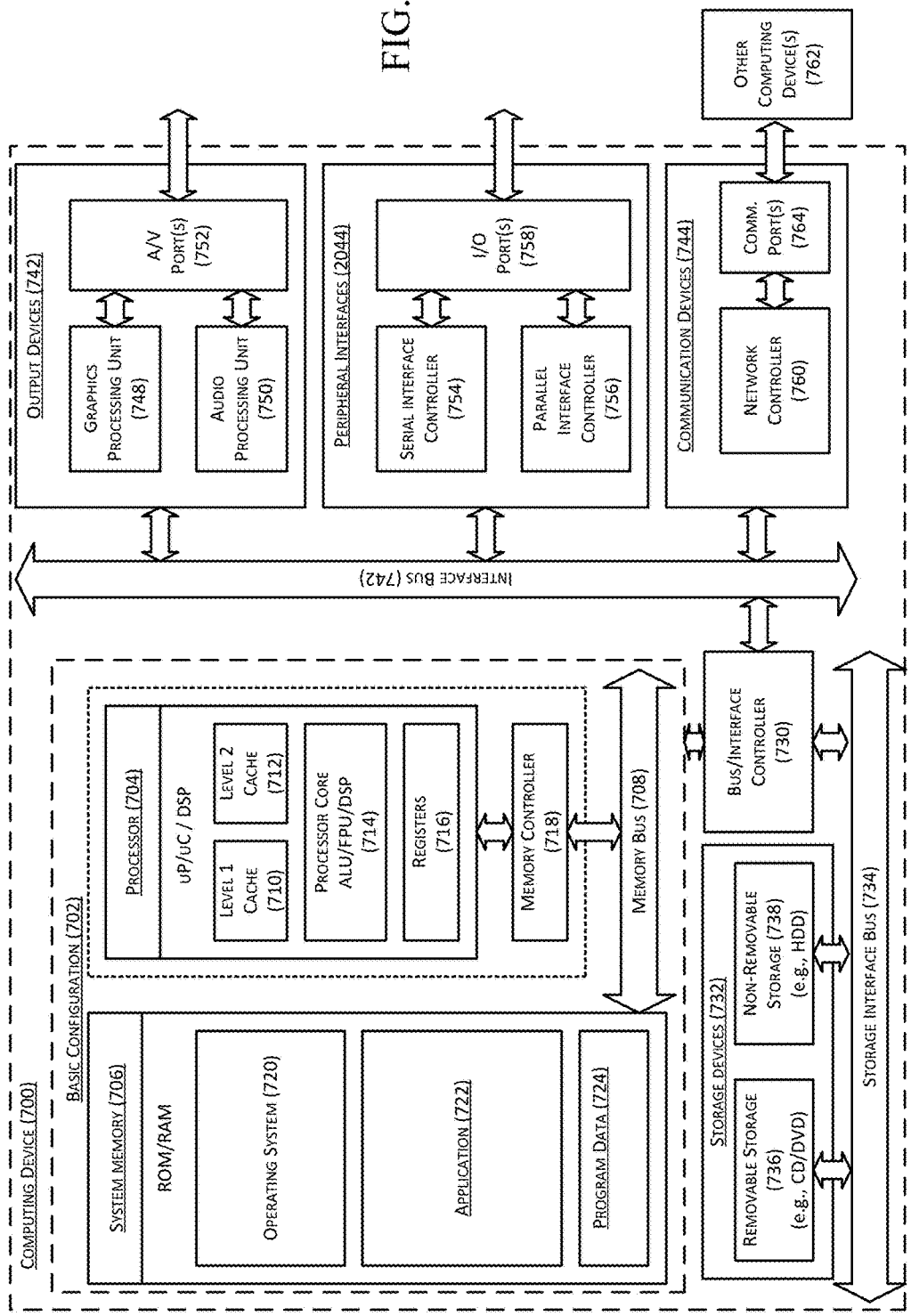
FIG. 22 is a computing device suitable for certain components of the computing system in FIG. 1.

FIG. 22 is a computing device 700 suitable for certain components of the computing framework 100 in FIG. 1. For example, the computing device 700 may be suitable for the performance analyzer 108 or the signal source 102 of FIG. 1. In a very basic configuration 702, computing device 700 typically includes one or more processors 704 and a system memory 706. A memory bus 708 may be used for communicating between processor 704 and system memory 706.

Depending on the desired configuration, the processor 704 may be of any type including but not limited to a microprocessor (pP), a microcontroller (pC), a digital signal processor (DSP), or any combination thereof. The processor 704 may include one more levels of caching, such as a level one cache 710 and a level two cache 712, a processor core 714, and registers 716. An example processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, the system memory 706 may be of any type including but not limited to volatile memory (such as RAM), non-volatile memory (such as ROM, flash memory, etc.) or any combination thereof. The system memory 706 may include an operating system 720, one or more applications 722, and program data 724. This described basic configuration 702 is illustrated in FIG. 22 by those components within the inner dashed line.

The computing device 700 may have additional features or functionality, and additional interfaces to facilitate communications between basic configuration 702 and any other devices and interfaces. For example, a bus/interface controller 730 may be used to facilitate communications between the basic configuration 702 and one or more data storage devices 732 via a storage interface bus 734. The data storage devices 732 may be removable storage devices 736, non-removable storage devices 738, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 700. Any such computer storage media may be part of computing device 700. The term "computer storage medium" excludes propagated signals and communication media.

The computing device 700 may also include an interface bus 740 for facilitating communication from various interface devices (e.g., output devices 742, peripheral interfaces 744, and communication devices 746) to the basic configuration 702 via bus/interface controller 730. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. The computing device 700 may also be implemented as a personal computer including both laptop computer and non-laptop computer configurations.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A method performed by a computing system having a processor, the method comprising:
   with the processor,
      receiving test data from a test power grid monitor coupled to a power grid signal source;
      receiving reference data from a reference power grid monitor coupled to the same power grid signal source;
      identifying a power grid condition based on the received test data and/or reference data;
      extracting a subset of the test data and a subset of the reference data corresponding to the identified power grid condition; and
      comparing the subset of the test data to the subset of the reference data to determine a measurement accuracy of the test power grid monitor.

2. The method of claim 1 wherein the test data or the reference data includes one or more of a time stamp, a voltage magnitude, a voltage angle, a current magnitude, a current angle, a frequency, or a rate of change of frequency.

3. The method of claim 1 wherein:
   the test data and the reference data individually include a plurality of data points with an associated time stamp; and the method further includes aligning the data points of the test data and the reference data based on the associated time stamps.

4. The method of claim 1 wherein identifying the power grid condition includes identifying a steady state condition or a dynamic condition.

5. The method of claim 1 wherein identifying the power grid condition includes identifying one of (1) a power system is balanced, (2) the power system is at off-nominal frequency, (3) the power system has harmonics, or (4) the power system is at off-nominal frequency and has harmonics.

6. The method of claim 1 wherein:
identifying the power grid condition includes identifying one of (1) a power system is balanced, (2) the power system is at off-nominal frequency, (3) the power system has harmonics, or (4) the power system is at off-nominal frequency and has harmonics; and
comparing the subset of the test data to the subset of the reference data includes calculating at least one of a total vector error, a frequency error, or a change error based on the subset of test data and the subset of reference data.

7. The method of claim 1 wherein:
identifying the power grid condition includes identifying a steady state condition having (1) a voltage or current magnitude change, (2) a voltage or current angle change, or (3) a frequency change; and
comparing the subset of the test data to the subset of the reference data includes calculating at least one of a total vector error, a frequency error, or a change error based on the subset of test data and the subset of reference data.

8. The method of claim 1 wherein:
identifying the power grid condition includes identifying a dynamic condition having (1) a voltage or current magnitude step change, (2) a voltage or current angle step change, (3) a frequency step change, (4) a frequency ramp, or (5) an amplitude, phase or frequency modulation; and
comparing the subset of the test data to the subset of the reference data includes calculating at least one of a total vector error, a frequency error, a change error, a response time, a delay time, a percent peak overshoot, or a rate of change of frequency based on the subset of test data and the subset of reference data.

9. The method of claim 1, further comprising generating the power grid signal via at least one of measuring current power grid parameters with the test power grid monitor and the reference power grid monitor, simulating a power grid using a power grid simulator, or retrieving historical power grid parameters.

10. A computing system, comprising:
a processor and a memory operative coupled to the processor, the memory containing instructions that when executed by the processor, cause the processor to perform a process include:
receiving test data from a test power grid monitor and reference data from a reference power grid monitor both coupled to a power grid signal source, the test data and the reference data individually including a plurality of data points with associated time stamps;
aligning the test data with the reference data based on the time stamps;
extracting a subset of the test data and a subset of the reference data corresponding to a power grid condition; and
determining an error of the subset of the test data in comparison to the subset of the reference data.

11. The computing system of claim 10 wherein determining the error includes determining a total vector error, a frequency error, or a change error based on the subset of test data and the subset of reference data.

12. The computing system of claim 10 wherein the power grid condition includes a steady state condition having (1) a voltage or current magnitude change, (2) a voltage or current angle change, or (3) a frequency change.

13. The computing system of claim 10 wherein the power grid condition includes a steady state condition having (1) a voltage or current magnitude change, (2) a voltage or current angle change, or (3) a frequency change, and wherein determining the error includes determining a total vector error, a frequency error, or a change error based on the subset of test data and the subset of reference data.

14. The computing system of claim 10 wherein the power grid condition includes a dynamic condition having (1) a voltage or current magnitude step change, (2) a voltage or current angle step change, (3) a frequency step change, (4) a frequency ramp, or (5) an amplitude, phase or frequency modulation.

15. The computing system of claim 10 wherein the power grid condition includes a dynamic condition having (1) a voltage or current magnitude step change, (2) a voltage or current angle step change, (3) a frequency step change, (4) a frequency ramp, or (5) an amplitude, phase or frequency modulation, and wherein determining the error includes calculating at least one of a total vector error, a frequency error, a change error, a response time, a delay time, a percent peak overshoot, or a rate of change of frequency based on the subset of test data and the subset of reference data.

16. The computing system of claim 10 wherein the process performed by the processor further includes determining a measurement accuracy of the test power grid monitor based on the determined error of the subset of the test data in comparison to the subset of the reference data.

17. A method performed by a computing system having a processor, the method comprising:
with the processor,
receiving test data from a test phasor measurement unit receiving input from a power grid signal source and reference data from a reference phasor measurement unit receiving input from the same power grid signal source;
monitoring a power grid condition based on the received test data and/or reference data, the power grid condition including at least one of a steady state condition or a dynamic condition and corresponding to a subset of the test data and the reference data;
determining a deviation between the subset of test data and reference data;
comparing the determined deviation to a threshold; and
in response to the determined deviation being less than the threshold, indicating the test phasor measurement unit as accurate.

18. The method of claim 17 wherein determining the deviation includes determining a total vector error, a frequency error, or a change error based on the subset of test data and the subset of reference data.

19. The method of claim 17 wherein the power grid condition includes a steady state condition having (1) a voltage or current magnitude change, (2) a voltage or current angle change, or (3) a frequency change, and wherein determining the deviation includes determining a total vector error, a frequency error, or a change error based on the subset of test data and the subset of reference data.

20. The method of claim 17 wherein the power grid condition includes a dynamic condition having (1) a voltage or current magnitude step change, (2) a voltage or current angle step change, (3) a frequency step change, (4) a frequency ramp, or (5) an amplitude, phase or frequency modulation, and wherein determining the deviation includes calculating at least one of a total vector error, a frequency error, a change error, a response time, a delay time, a percent peak overshoot, or a rate of change of frequency based on the subset of test data and the subset of reference data.

\* \* \* \* \*